(12) United States Patent
Yamasaki et al.

(10) Patent No.: US 9,900,539 B2
(45) Date of Patent: Feb. 20, 2018

(54) SOLID-STATE IMAGE PICKUP ELEMENT, AND IMAGE PICKUP SYSTEM

(71) Applicant: CANON KABUSHIKI KAISHA, Tokyo (JP)

(72) Inventors: Takahiro Yamasaki, Inzai (JP); Masaaki Minowa, Kawasaki (JP); Keisuke Ota, Tokyo (JP); Takamasa Sakuragi, Machida (JP); Noriyuki Kaifu, Atsugi (JP); Toru Koizumi, Yokohama (JP); Kazuhiro Saito, Tokyo (JP); Daisuke Kobayashi, Kawaguchi (JP)

(73) Assignee: Canon Kabushiki Kaisha, Tokyo (JP)

( * ) Notice: Subject to any disclaimer, the term of this patent is extended or adjusted under 35 U.S.C. 154(b) by 21 days.

(21) Appl. No.: 15/227,576

(22) Filed: Aug. 3, 2016

(65) Prior Publication Data
US 2017/0078603 A1    Mar. 16, 2017

(30) Foreign Application Priority Data

Sep. 10, 2015  (JP) ................................. 2015-178247
Mar. 17, 2016  (JP) ................................. 2016-053833

(51) Int. Cl.
*H04N 5/378* (2011.01)
*H01L 27/146* (2006.01)

(52) U.S. Cl.
CPC ....... *H04N 5/378* (2013.01); *H01L 27/14627* (2013.01); *H01L 27/14636* (2013.01); *H01L 27/14641* (2013.01); *H01L 27/14643* (2013.01)

(58) Field of Classification Search
CPC .............. H04N 5/378; H01L 27/14627; H01L 27/14636; H01L 27/14643; H01L 27/14641
See application file for complete search history.

(56) References Cited

U.S. PATENT DOCUMENTS

| 4,922,117 A | 5/1990 | Saika |
| 4,939,592 A | 7/1990 | Saika |

(Continued)

FOREIGN PATENT DOCUMENTS

JP   2008-85994   4/2008

OTHER PUBLICATIONS

U.S. Appl. No. 15/217,526, filed Jul. 22, 2016.

(Continued)

*Primary Examiner* — Albert Cutler
(74) *Attorney, Agent, or Firm* — Fitzpatrick, Cella, Harper & Scinto

(57) ABSTRACT

Provided is a solid-state image pickup element including: a plurality of pixels arranged in a pixel well region; a readout circuit arranged in a peripheral well region, having a first input terminal for receiving the pixel signals from the plurality of pixels and a second input terminal for receiving a reference signal; and a reference signal circuit arranged in the peripheral well region, having a first electrode to which a ground voltage is supplied, and being configured to output the reference signal to the second input terminal of the readout circuit, wherein a resistance value R1 of an electrical path from one of a plurality of pixel well contacts to the first electrode and a resistance value R2 of an electrical path from one of a plurality of peripheral well contacts closest to the first electrode to the first electrode satisfy a relationship of R1<R2.

17 Claims, 14 Drawing Sheets

(56) References Cited

U.S. PATENT DOCUMENTS

| | | | |
|---|---|---|---|
| 5,698,892 A | 12/1997 | Koizumi |
| 6,188,094 B1 | 2/2001 | Kochi |
| 6,271,880 B1 | 8/2001 | Kameshima |
| 6,605,850 B1 | 8/2003 | Kochi |
| 6,670,990 B1 | 12/2003 | Kochi |
| 6,717,151 B2 | 4/2004 | Tashiro |
| 6,798,453 B1 | 9/2004 | Kaifu |
| 6,800,836 B2 | 10/2004 | Hamamoto |
| 6,946,637 B2 | 9/2005 | Kochi |
| 6,960,751 B2 | 11/2005 | Hiyama |
| 7,016,089 B2 | 3/2006 | Yoneda |
| 7,023,482 B2 | 4/2006 | Sakuragi |
| 7,110,030 B1 | 9/2006 | Kochi |
| 7,129,458 B2 | 10/2006 | Hamamoto |
| 7,227,208 B2 | 6/2007 | Ogura |
| 7,321,110 B2 | 1/2008 | Okita |
| 7,324,144 B1 | 1/2008 | Koizumi |
| 7,348,615 B2 | 3/2008 | Koizumi |
| 7,408,210 B2 | 8/2008 | Ogura |
| 7,429,764 B2 | 9/2008 | Koizumi |
| 7,460,162 B2 | 12/2008 | Koizumi |
| 7,466,003 B2 | 12/2008 | Ueno |
| 7,528,878 B2 | 5/2009 | Sato |
| 7,538,810 B2 | 5/2009 | Koizumi |
| 7,547,871 B2 | 6/2009 | Hiyama |
| 7,550,793 B2 | 6/2009 | Itano |
| 7,554,591 B2 | 6/2009 | Kikuchi |
| 7,605,415 B2 | 10/2009 | Koizumi |
| 7,616,355 B2 | 11/2009 | Yoneda |
| 7,629,568 B2 | 12/2009 | Koizumi |
| 7,679,114 B2 | 3/2010 | Koizumi |
| 7,808,537 B2 | 10/2010 | Fujimura |
| 7,852,393 B2 | 12/2010 | Kikuchi |
| 7,859,575 B2 | 12/2010 | Ota |
| 7,864,384 B2 | 1/2011 | Yoneda |
| 7,872,286 B2 | 1/2011 | Okita |
| 7,906,755 B2 | 3/2011 | Koizumi |
| 7,907,196 B2 | 3/2011 | Ogura |
| 7,936,487 B2 | 5/2011 | Yoneda |
| 7,939,868 B2 | 5/2011 | Koizumi |
| 7,943,975 B2 | 5/2011 | Koizumi |
| 7,948,540 B2 | 5/2011 | Ogura |
| 7,948,541 B2 | 5/2011 | Koizumi |
| 7,961,237 B2 * | 6/2011 | Hatano | H04N 5/3742 348/241 |
| 7,973,839 B2 | 7/2011 | Koizumi |
| 7,978,241 B2 | 7/2011 | Koizumi |
| 8,053,718 B2 | 11/2011 | Koizumi |
| 8,063,958 B2 | 11/2011 | Okita |
| 8,085,319 B2 | 12/2011 | Ono |
| 8,089,545 B2 | 1/2012 | Koizumi |
| 8,120,681 B2 | 2/2012 | Ryoki |
| 8,169,525 B2 | 5/2012 | Ryoki |
| 8,174,600 B2 | 5/2012 | Ogura |
| 8,189,086 B2 | 5/2012 | Hashimoto |
| 8,207,561 B2 | 6/2012 | Koizumi |
| 8,248,677 B2 | 8/2012 | Yoneda |
| 8,274,105 B2 | 9/2012 | Koizumi |
| 8,278,613 B2 | 10/2012 | Okita |
| 8,310,576 B2 | 11/2012 | Hashimoto |
| 8,319,872 B2 | 11/2012 | Koizumi |
| 8,345,133 B2 | 1/2013 | Matsuda |
| 8,390,708 B2 | 3/2013 | Koizumi |
| 8,411,178 B2 | 4/2013 | Ogura |
| 8,416,473 B2 | 4/2013 | Yoneda |
| 8,421,894 B2 | 4/2013 | Koizumi |
| 8,441,558 B2 | 5/2013 | Okita |
| 8,477,224 B2 | 7/2013 | Ogura |
| 8,520,102 B2 | 8/2013 | Ogura |
| 8,520,108 B2 | 8/2013 | Ogura |
| 8,553,115 B2 | 10/2013 | Arishima |
| 8,553,118 B2 | 10/2013 | Saito |
| 8,553,119 B2 | 10/2013 | Hashimoto |
| 8,598,901 B2 | 12/2013 | Hiyama |
| 8,624,307 B2 | 1/2014 | Koizumi |
| 8,624,992 B2 | 1/2014 | Ota |
| 8,638,384 B2 | 1/2014 | Sakuragi |
| 8,670,049 B2 | 3/2014 | Ono |
| 8,670,056 B2 | 3/2014 | Kono |
| 8,698,935 B2 | 4/2014 | Okita |
| 8,711,259 B2 | 4/2014 | Maehashi |
| 8,749,675 B2 | 6/2014 | Koizumi |
| 8,749,683 B2 | 6/2014 | Minowa |
| 8,797,435 B2 | 8/2014 | Koizumi |
| 8,836,838 B2 | 9/2014 | Nakamura |
| 8,872,092 B2 | 10/2014 | Ryoki |
| 8,878,971 B2 | 11/2014 | Ryoki |
| 8,883,526 B2 | 11/2014 | Okita |
| 8,884,864 B2 | 11/2014 | Sakuragi |
| 8,896,029 B2 | 11/2014 | Koizumi |
| 8,922,668 B2 | 12/2014 | Ota |
| 8,928,786 B2 | 1/2015 | Iwata |
| 8,928,790 B2 | 1/2015 | Ogura |
| 8,957,364 B2 | 2/2015 | Ryoki |
| 8,975,676 B2 | 3/2015 | Koizumi |
| 9,007,501 B2 | 4/2015 | Matsuda |
| 9,029,752 B2 | 5/2015 | Saito |
| 9,048,155 B2 | 6/2015 | Matsuda |
| 9,083,906 B2 | 7/2015 | Nakamura |
| 9,113,103 B2 | 8/2015 | Matsuda |
| 9,118,857 B2 | 8/2015 | Iwata |
| 9,142,575 B2 | 9/2015 | Kobayashi |
| 9,232,164 B2 | 1/2016 | Minowa |
| 9,232,165 B2 | 1/2016 | Saito |
| 9,253,425 B2 | 2/2016 | Ryoki |
| 9,276,036 B2 | 3/2016 | Arishima |
| 9,300,884 B2 | 3/2016 | Minowa |
| 9,337,222 B2 | 5/2016 | Saito |
| 2008/0217718 A1 * | 9/2008 | Mauritzson | H01L 27/1463 257/444 |
| 2008/0290381 A1 * | 11/2008 | Mentzer | H01L 27/1463 257/291 |
| 2010/0321532 A1 | 12/2010 | Hashimoto |
| 2012/0001241 A1 * | 1/2012 | Park | H01L 27/1461 257/292 |
| 2012/0043454 A1 | 2/2012 | Sakuragi |
| 2012/0092532 A1 * | 4/2012 | Ladd | H01L 27/1463 348/241 |
| 2013/0020467 A1 * | 1/2013 | Johnson | H04N 5/3658 250/208.1 |
| 2013/0140435 A1 * | 6/2013 | Kikuchi | H01L 27/14806 250/208.1 |
| 2013/0181118 A1 | 7/2013 | Koizumi |
| 2015/0109504 A1 | 4/2015 | Sakuragi |
| 2015/0109505 A1 | 4/2015 | Sakuragi |
| 2015/0122975 A1 | 5/2015 | Saito |
| 2015/0237286 A1 | 8/2015 | Saito |
| 2015/0281614 A1 | 10/2015 | Yoshida |
| 2015/0281616 A1 | 10/2015 | Muto |
| 2015/0326812 A1 | 11/2015 | Sakuragi |
| 2016/0014356 A1 | 1/2016 | Sakuragi |
| 2016/0027825 A1 | 1/2016 | Moriyama |
| 2016/0099268 A1 | 4/2016 | Minowa |
| 2016/0133663 A1 | 5/2016 | Minowa |
| 2016/0150176 A1 | 5/2016 | Hiyama |
| 2016/0173797 A1 | 6/2016 | Minowa |
| 2016/0247846 A1 | 8/2016 | Iida |

OTHER PUBLICATIONS

U.S. Appl. No. 15/237,272, filed Aug. 15, 2016.
U.S. Appl. No. 15/258,805, filed Sep. 7, 2016.
U.S. Appl. No. 14/956,798, filed Dec. 2, 2015.
U.S. Appl. No. 15/143,724, filed May 2, 2016.
U.S. Appl. No. 15/143,817, filed May 2, 2016.

* cited by examiner

SOLID-STATE IMAGE PICKUP ELEMENT, AND IMAGE PICKUP SYSTEM

BACKGROUND OF THE INVENTION

Field of the Invention

The present invention relates to a technology of reducing magnetic noise caused in ground wiring in a solid-state image pickup element.

Description of the Related Art

In recent years, higher and higher image quality is desired in a solid-state image pickup element. In order to realize high image quality, noise suppression is essential. As such a method of suppressing noise, a technology of suppressing noise caused by a power supply configured to drive the solid-state image pickup element is described in, for example, Japanese Patent Application Laid-Open No. 2008-85994. In the technology described in Japanese Patent Application Laid-Open No. 2008-85994, noise is suppressed through holding, in a hold capacitor, a reference signal of a readout circuit.

In the related art described in Japanese Patent Application Laid-Open No. 2008-85994, noise caused in a signal line of the readout circuit can be suppressed, but noise caused in ground wiring is not taken into consideration. However, when there is a magnetic field, the influence of magnetic noise on the ground wiring cannot be neglected. The reason is that, when the ground wiring, together with a substrate inside or outside the solid-state image pickup element, is in the shape of a loop, induced electromotive force by Faraday's Law is caused in the ground wiring, and appears on a sensor output image as magnetic noise. Therefore, the technology described in Japanese Patent Application Laid-Open No. 2008-85994 has a problem in that magnetic noise caused in the ground wiring cannot be reduced.

SUMMARY OF THE INVENTION

According to one embodiment of the present invention, there is provided a solid-state image pickup element, comprising: a semiconductor substrate including a pixel well region and a peripheral well region; a pixel ground wiring arranged on the pixel well region; a peripheral ground wiring arranged on the peripheral well region; a plurality of pixel well contacts connecting the pixel ground wiring and the pixel well region; a plurality of peripheral well contacts connecting the peripheral ground wiring and the peripheral well region; a plurality of pixels arranged in the pixel well region in a plurality of columns, each of the plurality of pixels being configured to output a pixel signal; a readout circuit arranged in the peripheral well region, the readout circuit including a first input terminal configured to receive the pixel signal from each of the plurality of pixels and a second input terminal configured to receive a reference signal; a reference signal circuit arranged in the peripheral well region, the reference signal circuit including a first electrode to which a ground voltage is supplied, and being configured to output the reference signal to the second input terminal of the readout circuit; and a wiring connecting the first electrode of the reference signal circuit and the pixel ground wiring, wherein a resistance value R1 of an electrical path from one of the plurality of pixel well contacts to the first electrode and a resistance value R2 of an electrical path from one of the plurality of peripheral well contacts closest to the first electrode to the first electrode satisfy a relationship of R1<R2.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

Figure 1:
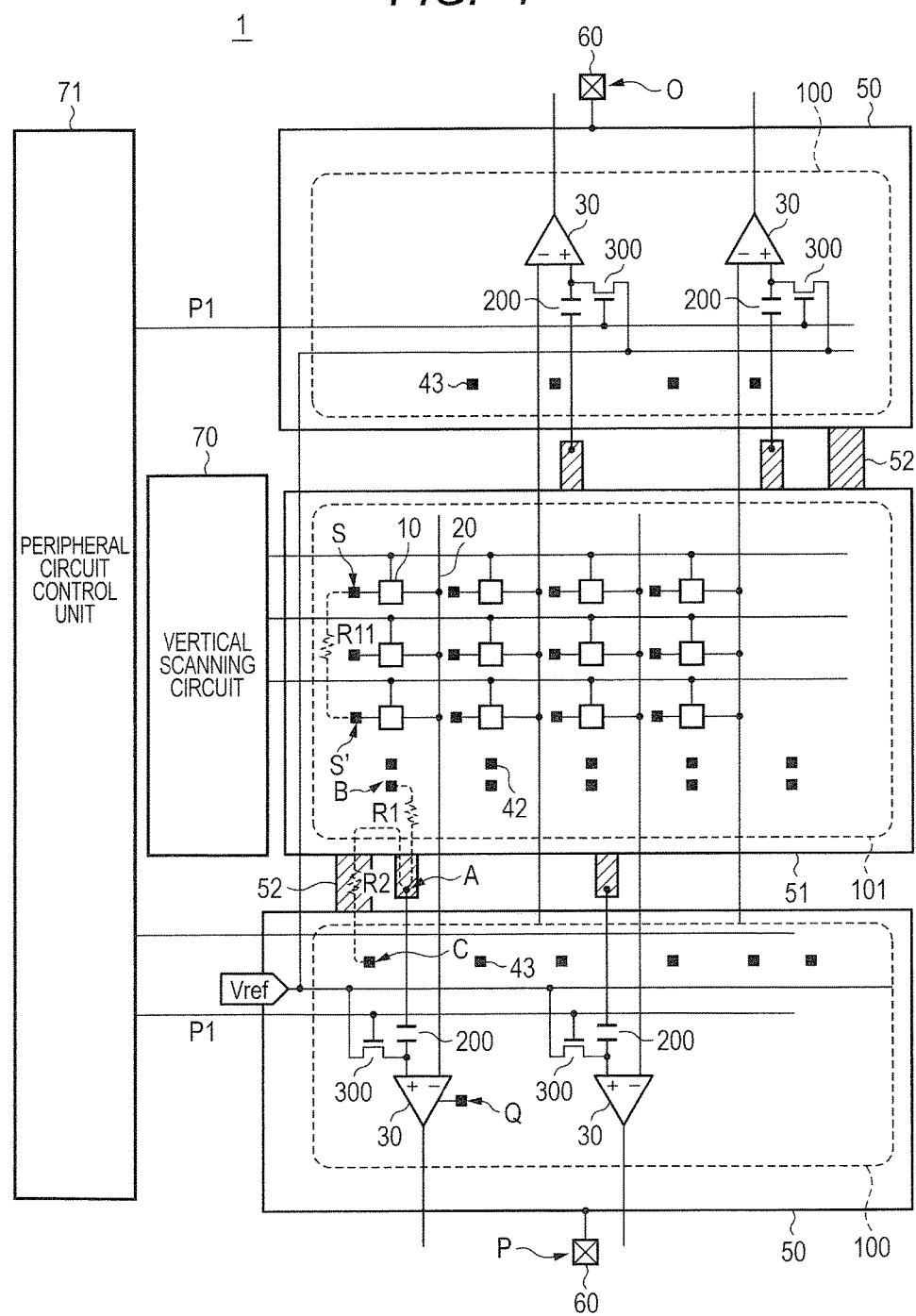
FIG. 1 is a schematic illustration of a configuration of a solid-state image pickup element according to a first embodiment of the present invention.

A solid-state image pickup device according to a first embodiment of the present invention is described with reference to FIG. 1 to FIG. 6. FIG. 1 is a schematic illustration of a configuration of a solid-state image pickup element 1 according to the first embodiment of the present invention. The solid-state image pickup element 1 illustrated in FIG. 1 includes a pixel well region 101, peripheral well regions 100, a vertical scanning circuit 70, and a peripheral circuit control unit 71. Each of the pixel well region 101 and the peripheral well region 100 is a semiconductor region formed on a semiconductor substrate. Pixel ground wiring 51 is arranged so as to completely overlap the pixel well region 101 when the semiconductor substrate is seen in plan view. Peripheral ground wiring 50 is arranged so as to completely overlap the peripheral well region 100 when the semiconductor substrate is seen in plan view. A pixel array is arranged in the pixel well region 101 in which the pixel ground wiring 51 is arranged, and a plurality of pixels 10 are two-dimensionally arranged therein in a row direction and in a column direction. Each pixel 10 includes a photoelectric convertor and an amplifier unit configured to output a signal based on charge generated by the photoelectric convertor. A signal depending on light is output from each pixel 10. The vertical scanning circuit 70 is, for example, a shift register, and controls drive of the pixels 10 row by row. The drive control includes reset operation of, accumulation operation in, and signal readout operation from the pixels 10.

Differential amplifier circuits 30 are arranged in the peripheral well region 100 in which the peripheral ground wiring 50 is arranged. A plurality of differential amplifier circuits 30 are arranged correspondingly to a plurality of columns of the plurality of pixels 10. The differential amplifier circuit 30 reads a signal from a plurality of pixels 10 included in a column corresponding thereto with reference to a reference signal. More specifically, the differential amplifier circuit 30 amplifies a difference between a signal that is input to a non-inverting input terminal (+) thereof and a signal that is input to an inverting input terminal (−) thereof and outputs the amplified signal to an image signal processing unit outside the solid-state image pickup element 1 (see FIG. 13 referred to below). In this case, pixel signals from a plurality of pixels 10 in the same column are input to the inverting input terminal (−) via corresponding one of a plurality of vertical signal lines 20 formed for the columns, respectively. Meanwhile, a control electrode of a hold capacitor 200 is connected to the non-inverting input terminal (+) and the reference signal is input to the non-inverting input terminal (+) via a switch transistor 300. A ground electrode of the hold capacitor 200 is connected to the pixel ground wiring 51. The hold capacitor 200 and the switch transistor 300 form a reference signal circuit configured to output the reference signal to the non-inverting input terminal (+). A reference signal source configured to supply the reference signal may be arranged in the solid-state image pickup element 1. Alternatively, the reference signal may be supplied from the outside of the solid-state image pickup element 1. A feedback unit and the like of the differential amplifier circuit 30 are omitted in the illustration of FIG. 1.

Through turning off the switch transistor 300, the hold capacitor 200 holds a reference signal Vref supplied from the reference signal source. Further, the switch transistor 300 is connected to the control electrode of the hold capacitor 200, and charges and discharges charge depending on the reference signal Vref held by the hold capacitor 200 in accordance with a control pulse P1 that is output from the peripheral circuit control unit 71 (see, for example, Japanese Patent Application Laid-Open No. 2008-85994). More specifically, when the switch transistor 300 is turned on before the operation of reading a signal from the pixel 10, the reference signal Vref is output to the non-inverting input terminal (+) of the differential amplifier circuit 30. At the same time, charge depending on the reference signal Vref is charged in the hold capacitor 200. When charge depending on the reference signal Vref is charged in the hold capacitor 200, even if the switch transistor 300 is turned off, the reference signal Vref for the operation of reading the signal from the pixel 10 is output from the hold capacitor 200. Therefore, through turning off the switch transistor 300, noise caused by the reference signal source can be reduced.

A plurality of peripheral well contacts 43 configured to connect the peripheral well region 100 and the peripheral ground wiring 50 are arranged on the peripheral well region 100. The peripheral ground wiring 50 is electrically connected to an external ground voltage outside the solid-state image pickup element 1 via an external ground terminal 60. On the other hand, a plurality of pixel well contacts 42 configured to connect the pixel well region 101 and the pixel ground wiring 51 are arranged on the pixel well region 101. Further, the pixel ground wiring 51 is electrically connected to the peripheral ground wiring 50 via a ground connecting part 52. Ground terminals of the photoelectric convertors and the amplifier units of the respective pixels 10 (hereinafter simply referred to as "ground terminals of the pixels 10") are electrically connected to the pixel ground wiring 51 via the pixel well contacts 42. The pixel well region 101 forms the ground terminals of the pixels 10. The pixel well contacts 42 and the peripheral well contacts 43 are not necessarily required to be regularly arranged as illustrated in FIG. 1.

Figure 2:
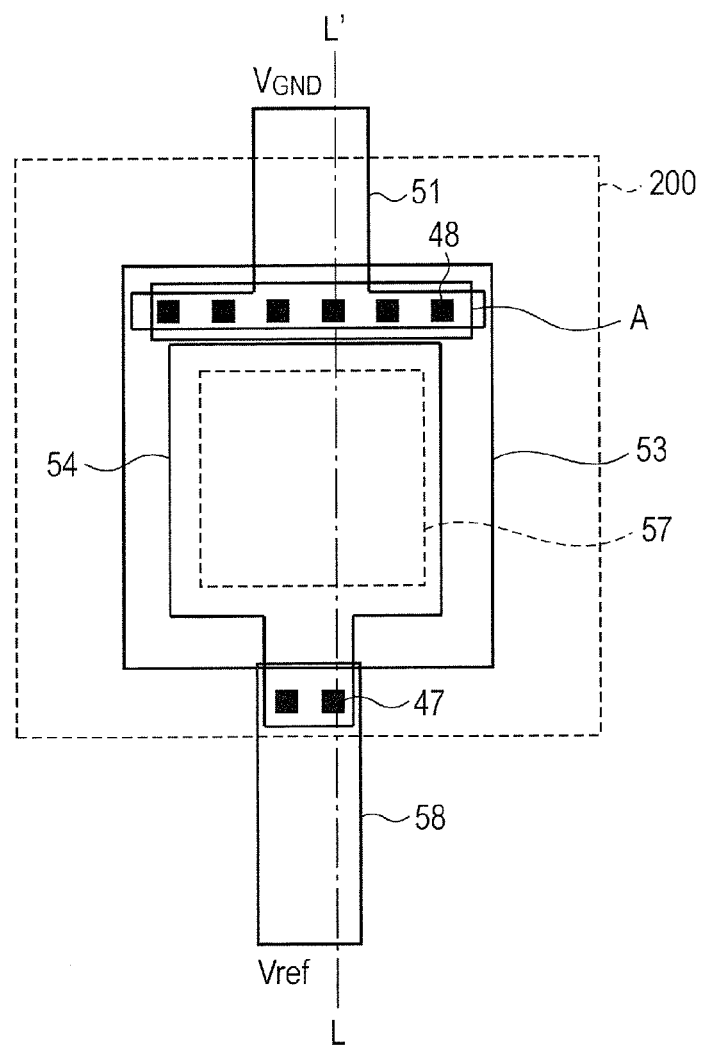
FIG. 2 is a schematic plan view for illustrating a configuration of a hold capacitor according to the first embodiment of the present invention.
Figure 3:
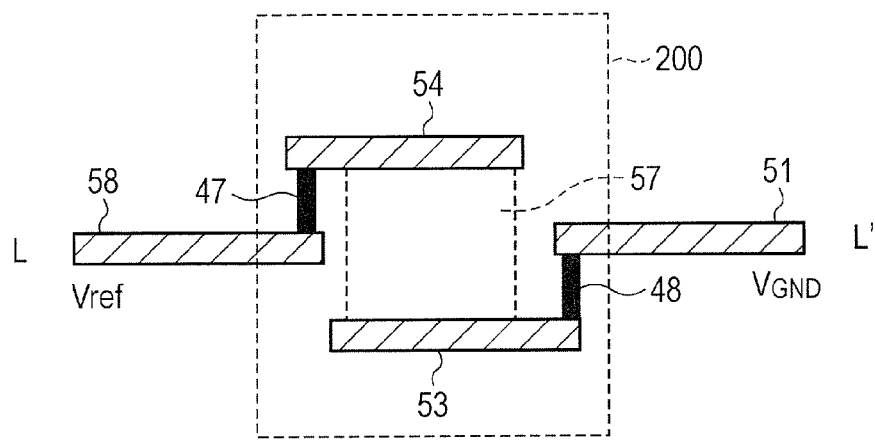
FIG. 3 is a schematic sectional view for illustrating the configuration of the hold capacitor according to the first embodiment of the present invention.

FIG. 2 is a schematic plan view for illustrating a configuration of the hold capacitor 200 according to the first embodiment of the present invention. Further, FIG. 3 is a schematic sectional view for illustrating the configuration of the hold capacitor 200 according to the first embodiment of the present invention. FIG. 3 is a sectional view taken along the dot-and-dash line L-L' of FIG. 2. As illustrated in FIG. 3, the hold capacitor 200 includes a control electrode 54 and a ground electrode 53. The control electrode 54 is supplied with the reference signal Vref from the reference signal source. The ground electrode 53 is connected to the pixel ground wiring 51 via a first contact 48. Further, the control electrode 54 is connected to the switch transistor 300 via a second contact 47 and wiring 58.

The ground electrode 53 and the control electrode are formed of a conductive material. Further, it is only necessary that the first contact 48 electrically connect the ground electrode 53 of the hold capacitor 200 to the pixel ground wiring 51. The first contact 48 and the pixel ground wiring 51 may be connected to each other via separate additional wiring. In this embodiment, the material forming the ground electrode 53 and the material forming the first contact 48 are different from each other. An end of the ground electrode 53 may be defined by an interface with a different material. In general, a process of forming the ground electrode 53 and a process of forming the first contact 48 are different from each other. For example, the ground electrode 53 is formed by patterning a metal layer. On the other hand, the first contact 48 is formed by embedding metal in a through hole formed in an insulating layer. As a modified example, the ground electrode 53 and the first contact 48 may be formed of the same material. For example, when the wiring is formed by a dual damascene process, the ground electrode 53 and the first contact 48 can be formed of the same material. In this case, a conductive material different from the material of the ground electrode 53 and the first contact 48, for example, a barrier metal may be arranged between the ground electrode 53 and the first contact 48. A plurality of processes of forming channels having different widths in the dual damascene process, which is used when the wiring is formed, are herein treated as different processes. Alternatively, the ground electrode 53 and the pixel ground wiring 51 may be integral with each other in the same wiring layer. This can eliminate the first contact 48. In this case, the ground electrode 53 is formed simultaneously with the pixel ground wiring 51. Further, an end of the ground electrode 53 is defined by projecting an end of the control electrode 54, which is opposite thereto, in a direction perpendicular to a surface of the semiconductor substrate. Further, an end of the pixel ground wiring 51 is defined by projecting the pixel well region 101 in the direction perpendicular to the surface of the semiconductor substrate. Further, through arranging the hold capacitor 200 in a well region separated from the peripheral well region 100, it is possible to use the separated well region as the ground electrode 53. In other words, the ground electrode 53 may be formed of a semiconductor region having a predetermined impurity concentration.

It is only necessary that the second contact 47 can electrically connect the control electrode 54 of the hold capacitor 200 to the wiring 58 to which the reference signal Vref is supplied. The second contact 47 can be eliminated through integrating the control electrode 54 with the wiring 58 to which the reference signal Vref is supplied.

Figure 4:
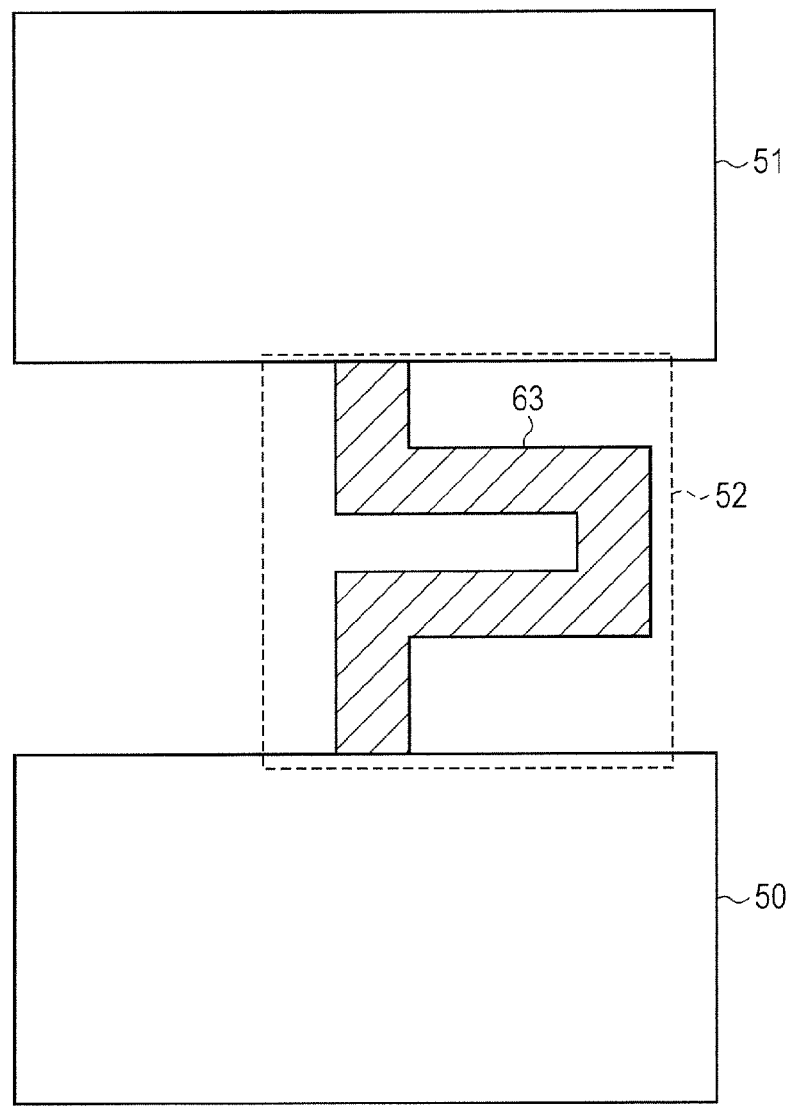
FIG. 4 is a schematic plan view for illustrating a configuration of a ground connecting part according to the first embodiment of the present invention.

FIG. 4 is a schematic plan view for illustrating a configuration of the ground connecting part 52 according to the first embodiment of the present invention. As illustrated in FIG. 4, the ground connecting part 52 according to this embodiment has a feature of including intermediate wiring 63 having a serpentine layout in the column direction and in the row direction. The column direction is a direction along columns of the plurality of pixels 10. The row direction is a direction intersecting the columns of the plurality of pixels 10. In general, such a wiring layout is not adopted for the reason that the layout needs a larger area. However, in this embodiment, the intermediate wiring 63 is intentionally laid out as described above. Consequently, the peripheral ground wiring 50 and the pixel ground wiring 51 are connected to each other with a high resistance to enable reduction of magnetic noise caused in the ground wiring as described later. An effect of this embodiment is described below. When the solid-state image pickup element 1 is applied to an image pickup system such as a camera, for example, a magnetic field generated by a motor for driving a lens of the camera is a magnetic noise source that affects the ground wiring.

Figure 5:
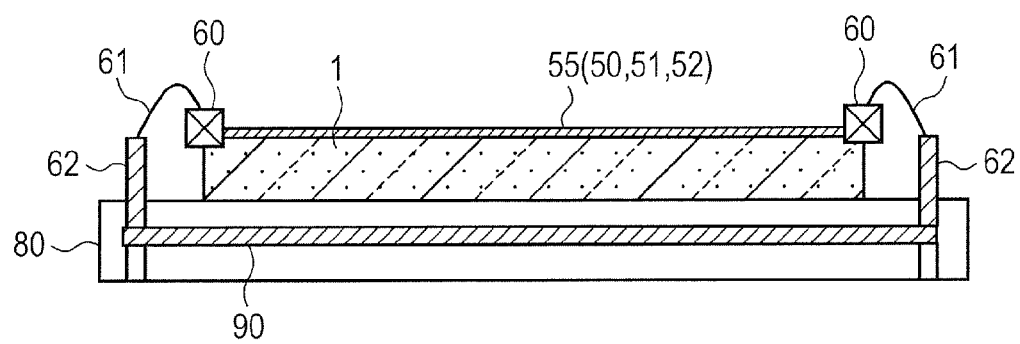
FIG. 5 is a schematic sectional view for illustrating a configuration of a package including the solid-state image pickup element according to the first embodiment of the present invention.

FIG. 5 is a schematic sectional view for illustrating a configuration of a package including the solid-state image pickup element 1 according to the first embodiment of the present invention. FIG. 5 is an illustration of a configuration in which the solid-state image pickup element 1 illustrated in FIG. 1 is supported by a package 80. In FIG. 5, the peripheral ground wiring 50, the pixel ground wiring 51, and the ground connecting part 52 illustrated in FIG. 1 are collectively illustrated as single ground wiring 55. The ground wiring 55 is electrically connected to external ground wiring 90, which is inner layer wiring of the package, via the external ground terminal 60, wire bonding 61, and a through via 62 of the package. In this case, the wire bonding 61 connects the external ground terminal 60 to the through via 62. In such a package configuration, the ground wiring 55 and the external ground wiring 90 form a loop (hereinafter referred to as "ground loop").

Figure 6:
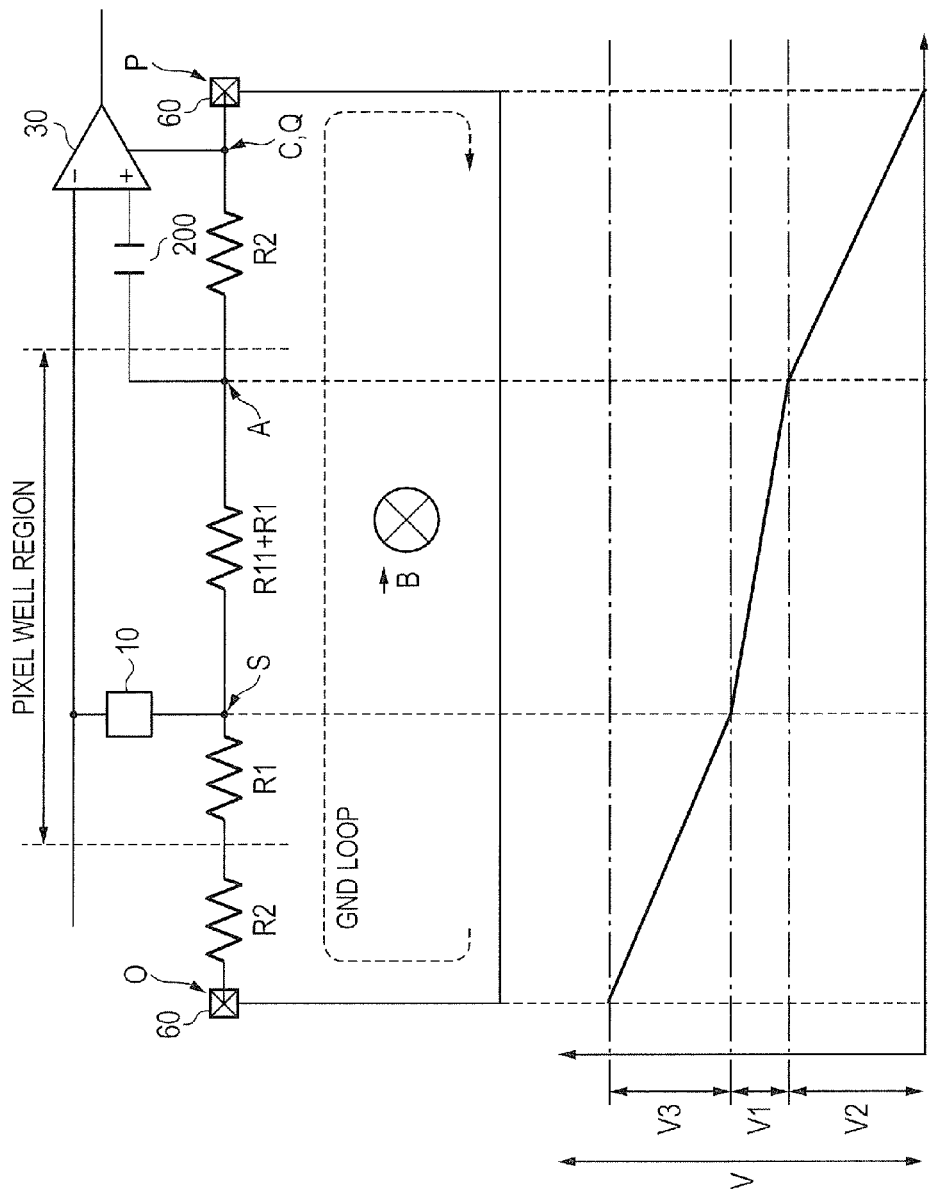
FIG. 6 is a schematic illustration of an equivalent circuit of a ground loop and a ground voltage distribution in the solid-state image pickup element according to the first embodiment of the present invention.

FIG. 6 is a schematic illustration of an equivalent circuit of the ground loop and a ground voltage distribution in the solid-state image pickup element 1 according to the first embodiment of the present invention. In the upper part of FIG. 6, there is illustrated a circuit equivalent to the ground loop illustrated in FIG. 5 for one column of pixels. In a field in which a magnetic field is present, when a magnetic flux B pierces the ground loop, an induced electromotive force V depending on change in the magnetic flux B over time is caused in the ground loop in accordance with Faraday's Law. The relationship between the induced electromotive force V that is caused and change ΔB in magnetic flux B in a micro time Δt is expressed as V=−ΔB/Δt.

When the magnetic flux B is in the opposite direction by 180°, the direction of the electromotive force and the direction of the current are in the opposite directions. Further, when the magnetic flux B is in a slanting direction with respect to a plane of the loop of the ground wiring, electromotive force is caused by a component of the magnetic flux B in a direction perpendicular to the plane of the loop. The electromotive force causes a voltage distribution in the ground loop in which the voltage is originally uniform, and the signal from the pixel 10 is influenced by the ground voltage distribution. This appears as pattern noise (magnetic noise) in an image output by the solid-state image pickup element 1. The external ground wiring 90 is not necessarily required to be in the package. Even when the solid-state image pickup element 1 is connected to a PCB substrate, if the ground loop is formed as described above, electromotive force is caused. Further, the ground loop is not necessarily required to be an electrically closed loop. For example, even when there is a break in the external ground wiring 90, the induced electromotive force V may be caused across the ground wiring 55 of the solid-state image pickup element 1.

Correspondence between the configuration of the solid-state image pickup element 1 illustrated in FIG. 1 and the equivalent circuit of the ground loop illustrated in FIG. 6 is described below. First, points A to C, 0 to Q, S, and S' on the ground loop illustrated in FIG. 1 are described. As described above, the first contact 48 illustrated in FIG. 3 connects the ground electrode 53 of the hold capacitor 200 to the pixel ground wiring 51 in the pixel well region 101. A point of contact between the first contact 48 and the ground electrode 53 is referred to as the point A. The point A illustrated in FIG. 1 is, strictly speaking, not on the ground loop, but is located on the first contact 48 that connects the ground electrode 53 of the hold capacitor 200 to the ground loop. However, in this embodiment, the components from the pixel ground wiring 51 to the hold capacitor 200 are connected with low resistance wiring, and thus, the voltage can be regarded as being approximately uniform. Therefore, in FIG. 6, the point A is illustrated on the ground loop.

Next, in the pixel well region 101, among the plurality of pixel well contacts 42 connected to the pixel ground wiring 51, a pixel well contact 42 having the smallest electrical resistance value to the point A is referred to as the point B. Similarly, in the peripheral well region 100, among the plurality of peripheral well contacts 43 connected to the peripheral ground wiring 50, a peripheral well contact 43 that is arranged closest to the ground electrode 53 is referred to as the point C. In this embodiment, when electrical resistance values from the plurality of peripheral well contacts 43, respectively, to the ground electrode 53 are compared to each other, the electrical resistance value from the peripheral well contact 43 arranged at the point C to the ground electrode 53 is the smallest. The point A, the point B, and the point C are illustrated in FIG. 1.

Next, among the peripheral well contacts 43 connected to the ground terminals of the differential amplifier circuits 30, a peripheral well contact 43 having the smallest electrical resistance value to the point A is referred to as the point Q. The ground terminal of the differential amplifier circuit 30 is, for example, a source region of a MOS transistor included in the differential amplifier circuit 30. The ground terminal of the differential amplifier circuit 30 is connected to the peripheral ground wiring. Further, a pixel well contact 42 connected to the ground terminal of the pixel 10 that is the farthest from the differential amplifier circuit 30 in the same column as the differential amplifier circuit 30 is referred to as the point S. Similarly, a pixel well contact 42 connected to the ground terminal of the pixel 10 that is the closest to the differential amplifier circuit 30 in the same column as the differential amplifier circuit 30 is referred to as the point S'. When there are a plurality of points S or S', a peripheral well contact 43 having the smallest electrical resistance value from the ground terminal of the pixel 10 is representatively referred to as the point S or the point S'. The point Q, the point S, and the point S' are illustrated in FIG. 1.

Among the external ground terminals 60 connecting the peripheral ground wiring 50 to a reference voltage outside the solid-state image pickup element 1, the external ground terminal 60 connected to the ground terminal of the differential amplifier circuit 30 without passing through the pixel ground wiring 51 is referred to as the point P. Further, the external ground terminal 60 connected to the ground terminal of the differential amplifier circuit 30 via the pixel ground wiring 51 is referred to as the point O. The point P and the point O are illustrated in FIG. 1.

Next, electrical resistance values between the respective points in the equivalent circuit of the ground loop illustrated in FIG. 6 are described with reference to FIG. 1 and FIG. 6. Like reference symbols are used to designate like elements in FIG. 1 and FIG. 6. First, the electrical resistance between the points A and P is described. The electrical resistance value between the points A and C is represented by R2. In this embodiment, the intermediate wiring 63 has a large electrical resistance value, and thus, R2 can be regarded as being approximately equal to the electrical resistance value of the intermediate wiring 63. Further, the electrical resistance values between the points C and P and between the points C and Q are sufficiently small with respect to the electrical resistance value R2, and are thus ignorable on the equivalent circuit. Therefore, the electrical resistance value between the points A and P is approximated as R2. Similarly, the electrical resistance value from the point A to the peripheral ground wiring 50 is approximated as R2. Further, the electrical resistance value from the point A to any one of the peripheral well contacts 43 connected to the peripheral ground wiring 50 is approximated as R2.

Next, the electrical resistance between the points A and S is described. The electrical resistance value between the points A and B is represented by R1 and the electrical resistance value between the points S' and S is represented by R11. In this case, the point B and the point S' are close to each other. The electrical resistance value between the points B and S' is sufficiently small with respect to the electrical resistance value R11 between the points S' and S, and is thus ignorable on the equivalent circuit. Therefore, the electrical resistance value between the points A and S is approximated as R11+R1.

Next, the electrical resistance between the points S and 0 is described. A portion between the points S and 0 is equivalent to a portion between the points S' and P in terms of the circuit, and thus, the portion between the points S and 0 can be regarded as being equivalent to a series connection between the points A and S' (electrical resistance value R1) and the points A and P (electrical resistance value R2). Therefore, the electrical resistance value between the points S and 0 is approximated as R1+R2.

The pixel ground wiring 51 has an electrical resistance that is uniform within the plane, and thus, the electrical resistance value of the ground wiring is generally in proportion to the length of the wiring. It follows that, in general, R11>R1. Further, R1 actually includes the electrical resistance value of the wiring from the ground electrode 53 of the hold capacitor 200 to the pixel ground wiring 51, but this electrical resistance value is sufficiently small with respect to R11 and R1, and is thus ignorable on the equivalent circuit.

Taking the approximations described above into consideration, the electrical resistance values R1, R11+R1, and R2 can be regarded as the electrical resistance value between the points A and S', the electrical resistance value between the points A and S, and the electrical resistance value between the points A and Q, respectively, on the equivalent circuit. In other words, the electrical resistance values R1 and R11+R1 are approximated as the minimum value and the maximum value, respectively, of the electrical resistance values from the pixel well contacts 42, which are connected to the ground terminals of the plurality of pixels 10 in the same column as the differential amplifier circuit 30, to the first contact 48. The electrical resistance values R1 and R11+R1 are resistance values of electrical paths on the pixel ground wiring 51. Further, the electrical resistance value R2 is approximated as the minimum value of the electrical resistance values from the peripheral well contacts 43 connected to the peripheral ground wiring 50 to the first contact 48, that is, the electrical resistance value of the ground connecting part 52.

In this embodiment, the relationship of R1<R2 is satisfied, and the following effect is provided. The relationship between the electrical resistance values between the respective points in the equivalent circuit of the ground loop illustrated in FIG. 6 and the induced electromotive force is described. As described above, when the magnetic flux B pierces the ground loop, the induced electromotive force V depending on change in the magnetic flux B over time is caused in the ground loop. FIG. 6 is an illustration of an induced voltage difference V1 between the points A and S, an induced voltage difference V2 between the points A and P, and an induced voltage difference V3 between the points S and 0 of the induced electromotive force V caused in the ground loop. Those induced voltage differences V1 to V3 are the induced electromotive force V divided by the electrical resistance values in the corresponding portions, respectively, and thus, are expressed by Expressions (1) to (3) below.

$$V1 = V \times (R11+R1)/(R11+2 \times R1+2 \times R2) \quad (1)$$

$$V2 = V \times R2/(R11+2 \times R1+2 \times R2) \quad (2)$$

$$V3 = V \times (R2+R1)/(R11+2 \times R1+2 \times R2) \quad (3)$$

The signal from the pixel 10 that is input to the inverting input terminal (−) of the differential amplifier circuit 30 includes, as magnetic noise, the induced voltage difference V1+V2 at the point S at which the ground terminal of the pixel 10 is connected. On the other hand, the reference signal that is input to the non-inverting input terminal (+) of the differential amplifier circuit 30 includes, as magnetic noise, the induced voltage difference V2 at the point A at which the ground electrode 53 of the hold capacitor 200 is connected. Therefore, a magnetic noise output Vout of the differential amplifier circuit 30 includes the induced voltage difference V1 between the points A and S as expressed by Expression (4) below.

$$Vout = (V1 + V2) - (V2) \qquad (4)$$
$$= V1$$

Therefore, when Expression (1) above is expressed as $$V1 = k \times V \qquad (1')$$

where $k=(R11+R1)/(R11+2\times R1+2\times R2)<1$, it can be understood that the magnetic noise output Vout=k×V can be reduced through reducing the proportionality constant k by adjusting the electrical resistance values R1, R11, and R2. Thus, in this embodiment, through employing the serpentine layout of the intermediate wiring 63 in the column direction and in the row direction as illustrated in FIG. 4, the electrical resistance value R2 of the ground connecting part 52 is increased so as to satisfy Expression (5) below.

$$R11+R1<R2 \qquad (5)$$

When, for example, R11+R1<R2, from Expressions (1) to (3) above, V1<V2 and V1<V3, and thus, the magnetic noise output Vout (=V1) can be reduced.

In the equivalent circuit illustrated in FIG. 6, the pixel 10 that is the farthest from the differential amplifier circuit 30 in the same column as the differential amplifier circuit 30 (having the electrical resistance value of R11+R1) represents the pixel 10 connected to the inverting input terminal (−) of the differential amplifier circuit 30, but other pixels 10 may be a representative. For example, the pixel 10 that is the closest to the differential amplifier circuit 30 in the same column as the differential amplifier circuit 30 (having the electrical resistance value of R1) may represent the pixel 10 connected to the inverting input terminal (−). In this case, instead of Expression (5) above, Expression (6) below is applied.

$$R1<R2 \qquad (6)$$

Also in this case, for example, when R1<R2, similarly, V1<V2 and V1<V3, and thus, the magnetic noise output Vout (=V1) can be reduced.

As described above, a first feature of this embodiment is that the ground electrode 53 of the hold capacitor 200 is connected to the pixel ground wiring 51 via the first contact 48. A second feature of this embodiment is that the electrical resistance value R2 of the ground connecting part 52 that connects the pixel ground wiring 51 to the peripheral ground wiring 50 is set to be large so as to satisfy Expression (6) above. This can reduce magnetic noise caused in the ground wiring.

Here, a case in which the first feature of the present invention described above is not satisfied is considered. This is, for example, a case in which the ground electrode 53 of the hold capacitor 200 is connected not to the pixel ground wiring 51 (point A) but to the peripheral ground wiring 50 (point Q). In this case, the magnetic noise output Vout of the differential amplifier circuit 30 includes the induced voltage difference V1+V2 between the points S and Q in the equivalent circuit illustrated in FIG. 6 as expressed by Expression (7) below.

$$Vout = (V1+V2) \qquad (7)$$
$$= V \times (R11+R1+R2)/(R11+2\times R1+2\times R2)$$

In this case, the electrical resistance values R1, R11, and R2 are included both in the numerator and in the denominator of Expression (7) above, and thus, the magnetic noise output Vout cannot be reduced no matter how the electrical resistance values R1, R11, and R2 are adjusted.

Next, a case in which the second feature of the present invention described above is not satisfied is considered. This is a case in which the electrical resistance value R2 of the ground connecting part 52 does not satisfy Expression (5) or (6) and, for example, R11+R1>>R2. In this case, from (1) to (3), V1>V3>>V2≈0. Therefore, also in this case, the magnetic noise output Vout cannot be reduced.

As described above, in this embodiment, the readout circuit (differential amplifier circuit) is included that is arranged in the peripheral well region in which the peripheral ground wiring is arranged and that is configured to read a signal from a pixel in the same column with reference to the reference signal. Further, a first electrode (ground electrode) to which a ground voltage is supplied from the pixel ground wiring, a second electrode (control electrode) arranged so as to oppose the first electrode, and the reference signal circuit (hold capacitor) configured to output the reference signal to the readout circuit are included. Further, the minimum value R2 of the electrical resistance values from the pixel ground wiring to the peripheral ground wiring is set to be large so as to satisfy Expression (6) above. Consequently, it is possible to obtain a solid-state image pickup element, a method of manufacturing a solid-state image pickup element, and an image pickup system that can reduce magnetic noise caused in the ground wiring without additionally providing a circuit for reducing the noise.

In FIG. 4, the ground connecting part 52 includes one intermediate wiring 63, but the ground connecting part 52 may include a plurality of wirings. Further, it is only necessary that the ground connecting part 52 be electrically connected to the peripheral ground wiring 50 and the pixel ground wiring 51. Further, a case is described in which each of the peripheral ground wiring 50 and the pixel ground wiring 51 is arranged in one layer, but the wirings may be arranged in a plurality of layers. Further, the peripheral ground wiring 50 and the pixel ground wiring 51 may have any shape.

Further, in FIG. 1, a layout is illustrated in which the peripheral well region 100 includes a first peripheral well region arranged on one side of the pixel well region 101 and a second peripheral well region arranged on another side thereof. However, the present invention is not limited to such a configuration. A similar effect can be obtained, for example, even when the first peripheral well region and the second peripheral well region are connected to each other around the pixel well region 101, or even when the peripheral well region 100 includes only the first peripheral well region.

Second Embodiment

Figure 7:
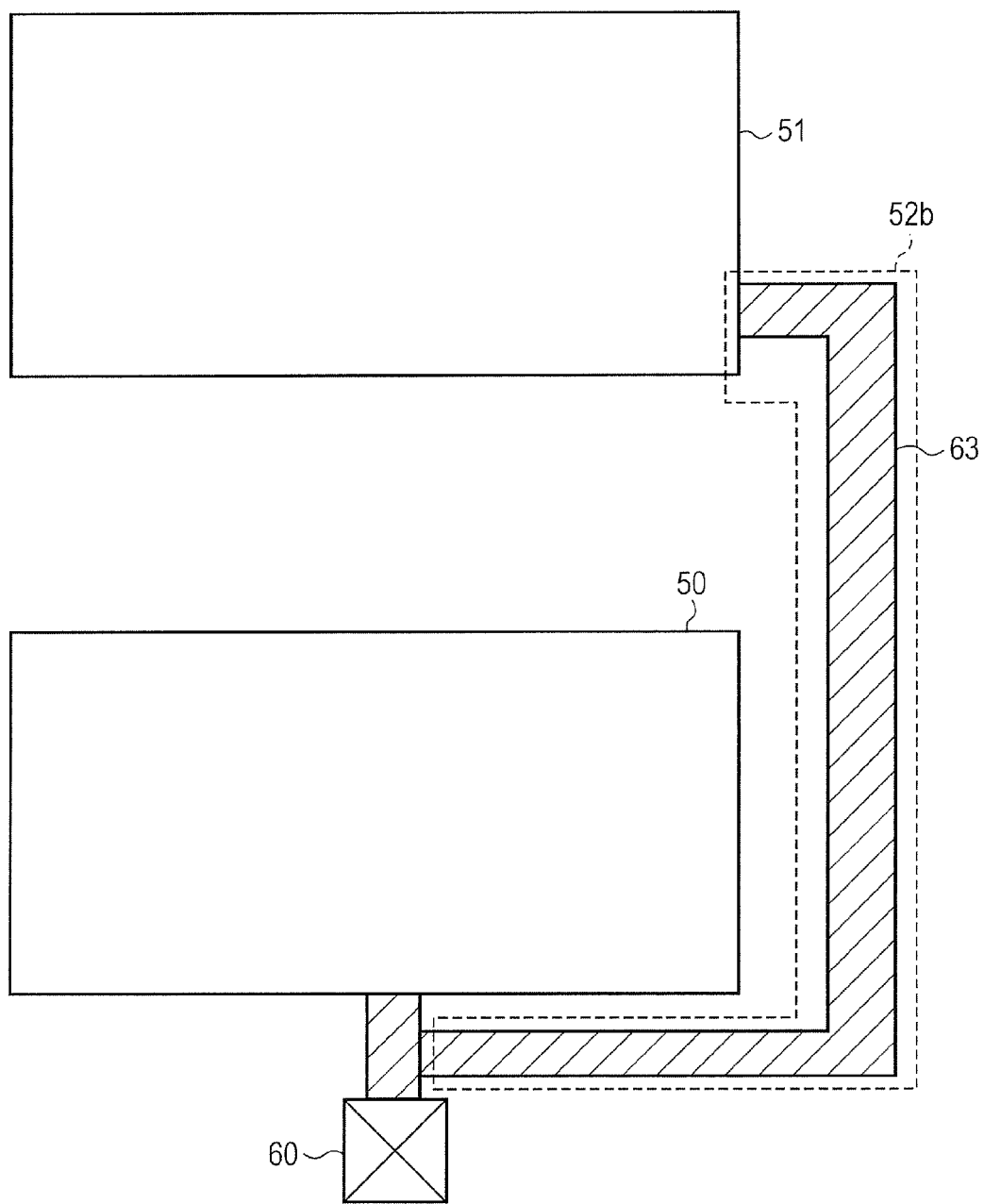
FIG. 7 is a schematic plan view for illustrating a configuration of a ground connecting part according to a second embodiment of the present invention.

A solid-state image pickup device according to a second embodiment of the present invention is described with reference to FIG. 7. FIG. 7 is a schematic plan view for illustrating a configuration of a ground connecting part 52b according to the second embodiment of the present invention. This embodiment is different from the first embodiment in that the ground connecting part 52b is electrically connected to the external ground voltage outside the solid-state image pickup element 1 via the external ground terminal 60. Other points are the same as those of the first embodiment, and thus, description thereof is omitted.

In the ground connecting part 52b illustrated in FIG. 7, the intermediate wiring 63 according to the first embodiment illustrated in FIG. 4 is electrically connected to the external ground voltage outside the solid-state image pickup element 1 via the external ground terminal 60. Also in this case, similarly to the case of the first embodiment, the peripheral ground wiring 50 and the pixel ground wiring 51 are connected to each other with the large electrical resistance value R2 depending on the length of the intermediate wiring 63. Therefore, also in this embodiment, Expression (6) above is satisfied, and thus, magnetic noise caused in the ground wiring can be reduced.

The intermediate wiring 63 may be a plurality of wirings. Further, the intermediate wiring 63 may be connected to a connecting line configured to connect the peripheral ground wiring 50 to the external ground terminal 60 as illustrated in FIG. 7, or may be directly connected to the external ground terminal 60. It is also possible to combine this embodiment with the first embodiment.

Third Embodiment

Figure 8:
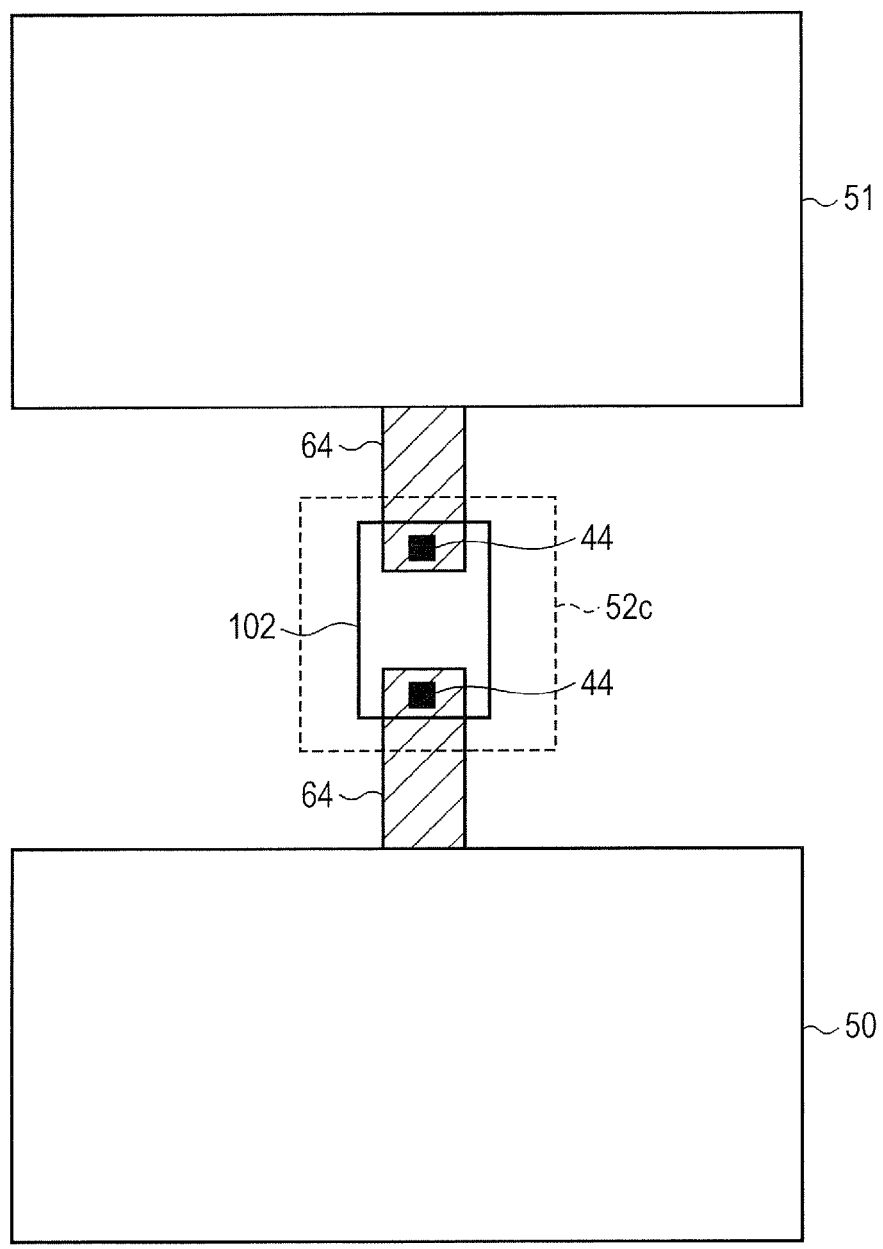
FIG. 8 is a schematic plan view for illustrating a configuration of a ground connecting part according to a third embodiment of the present invention.

A solid-state image pickup device according to a third embodiment of the present invention is described with reference to FIG. 8. FIG. 8 is a schematic plan view for illustrating a configuration of a ground connecting part 52c according to the third embodiment of the present invention. This embodiment is different from the first embodiment in that intermediate wiring 64 passes through a well region 102 that is different from any one of the pixel well region 101 and the peripheral well region 100. Other points are the same as those of the first embodiment, and thus, description thereof is omitted.

The ground connecting part 52c illustrated in FIG. 8 is configured such that the intermediate wiring 64 passes through the well region 102 that is different from any one of the pixel well region 101 and the peripheral well region 100 illustrated in FIG. 1. The well region 102 has no connection with the pixel well region 101 and the peripheral well regions 100 via a well. The well region 102 is connected to the peripheral ground wiring 50 and to the pixel ground wiring 51 via well contacts 44, respectively. The well region 102 and the peripheral ground wiring 50, and the well region 102 and the pixel ground wiring 51, are not necessarily required to be connected to each other via a single well contact 44 as illustrated in FIG. 8. For example, the connection may be made via a plurality of well contacts 44.

In the configuration described above, the peripheral well region 100 and the pixel well region 101 are connected to each other via the high resistance well region 102. Consequently, Expression (6) is satisfied in this embodiment similarly to the case of the first embodiment, and thus, magnetic noise caused in the ground wiring can be reduced. The well region 102 may be a plurality of well regions insofar as the conditions described above are satisfied. It is also possible to combine this embodiment with the first and second embodiments.

Fourth Embodiment

Figure 9:
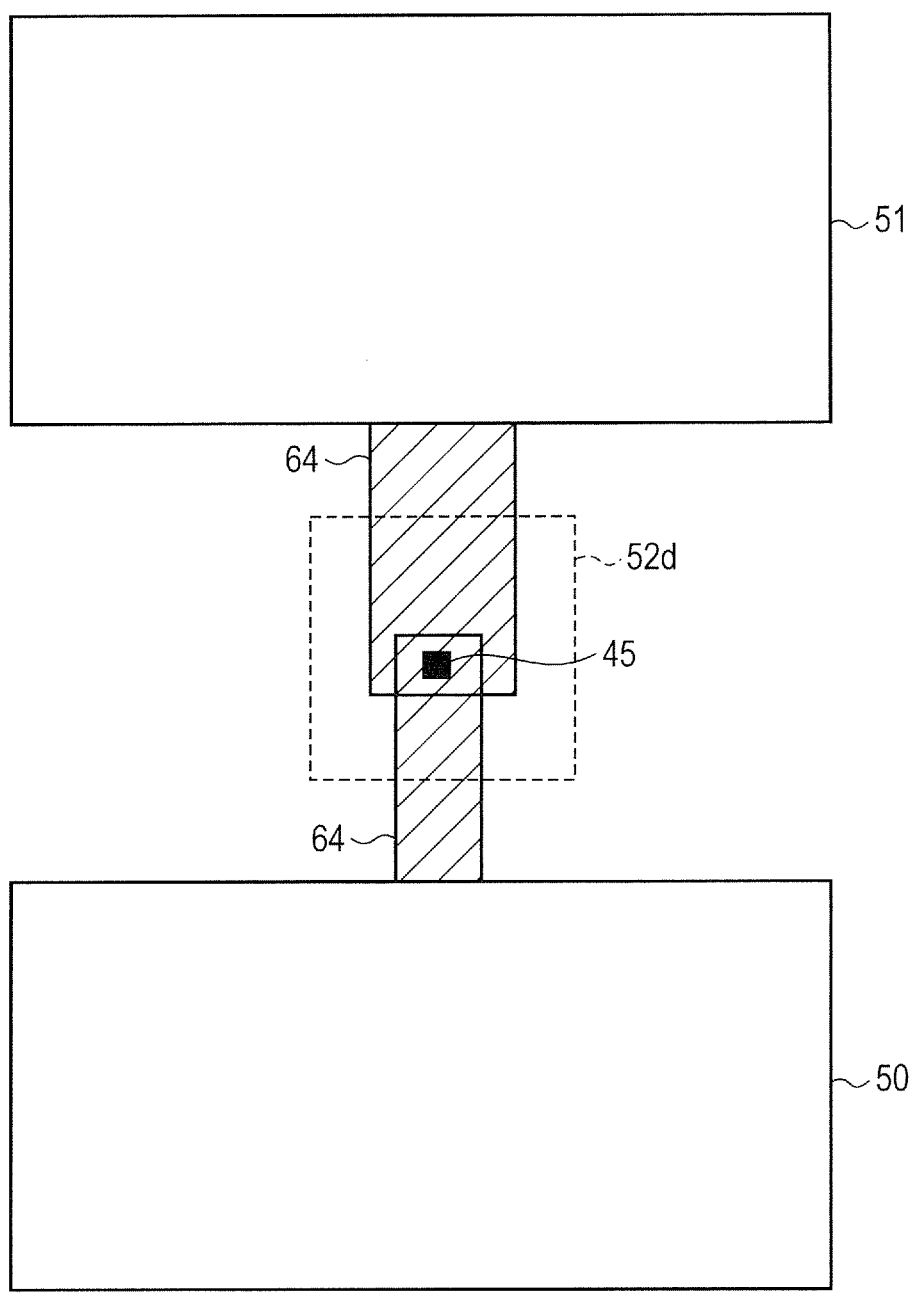
FIG. 9 is a schematic plan view for illustrating a configuration of a ground connecting part according to a fourth embodiment of the present invention.

A solid-state image pickup device according to a fourth embodiment of the present invention is described with reference to FIG. 9. FIG. 9 is a schematic plan view for illustrating a configuration of a ground connecting part 52d according to the fourth embodiment of the present invention. This embodiment is different from the first embodiment in that the intermediate wiring 64 electrically connects different wiring layers via a well contact 45. Other points are the same as those of the first embodiment, and thus, description thereof is omitted.

The intermediate wiring 64 illustrated in FIG. 9 passes through the well contact 45 arranged between the peripheral ground wiring 50 and the pixel ground wiring 51 as illustrated in FIG. 9. The peripheral ground wiring 50 and the pixel ground wiring 51 are arranged in different layers. Consequently, the peripheral ground wiring 50 and the pixel ground wiring 51 are connected to each other via the high resistance well contact 45. Also in this embodiment, with the configuration described above, Expression (6) above is satisfied similarly to the case of the first embodiment, and thus, magnetic noise caused in the ground wiring can be reduced. It is also possible to combine this embodiment with the first to third embodiments.

Fifth Embodiment

Figure 10:
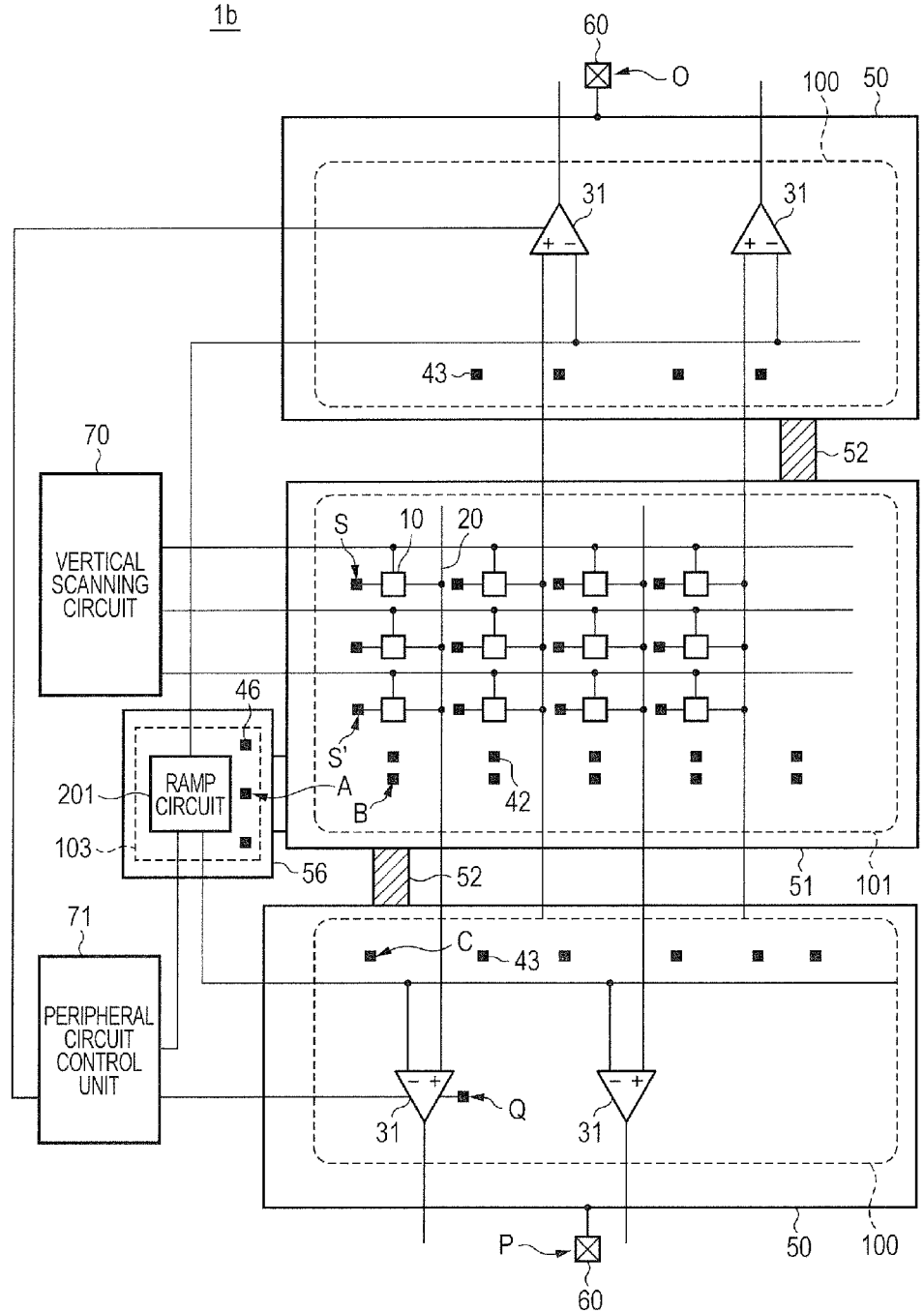
FIG. 10 is a schematic illustration of a configuration of a solid-state image pickup element according to a fifth embodiment of the present invention.

A solid-state image pickup device according to a fifth embodiment of the present invention is described with reference to FIG. 10 and FIG. 11 and FIG. 12A to FIG. 12C. FIG. 10 is a schematic illustration of a configuration of a solid-state image pickup element 1b according to the fifth embodiment of the present invention. In the first embodiment, a case is described in which the readout circuit includes the differential amplifier circuit 30 configured to amplify the signal from the pixel 10 with reference to a reference signal. On the other hand, in this embodiment, a case is described in which the readout circuit includes an analog-to-digital converter (AD converter) 31 configured to perform analog-to-digital conversion (A/D conversion) of the signal from the pixel 10 with reference to the reference signal.

In the solid-state image pickup element 1b according to this embodiment illustrated in FIG. 10, the differential amplifier circuits 30 according to the first embodiment illustrated in FIG. 1 are replaced by the AD converters 31. The AD converters 31 are arranged in the peripheral well region 100, and read a signal from pixels 10 in the same column with reference to the reference signal. More specifically, through comparing the signal from the pixel 10 with a RAMP signal that is output from a ramp signal generating circuit 201, the AD converter 31 performs A/D conversion of an analog signal from the pixel 10 into a digital signal. The AD converter 31 illustrated in FIG. 10 is only conceptually illustrated and a peripheral circuit is omitted.

The ramp signal generating circuit 201 is arranged in a third well region 103 in which ground wiring 56 is arranged. The ground wiring 56 in the third well region 103 is connected to the pixel ground wiring 51 with low resistance. In other words, the third well region 103 can be regarded as sharing the pixel ground wiring 51 with the pixel well region 101. A ground terminal of the ramp signal generating circuit 201 is connected, via well contacts 46, to the ground wiring 56 that is connected to the pixel ground wiring 51. Therefore, the RAMP signal that is output from the ramp signal generating circuit 201 is generated with the pixel ground wiring 51 being at the reference voltage. The AD converter 31 and the ramp signal generating circuit 201 are controlled by the peripheral circuit control unit 71.

Here, comparison is made between the solid-state image pickup element 1 according to the first embodiment illustrated in FIG. 1 and the solid-state image pickup element 1b according to this embodiment illustrated in FIG. 10. Then, it can be understood that, through regarding the well contact 46 illustrated in FIG. 10 as the first contact 48, the method in the first embodiment can be applied as it is. Therefore, in the description below of this embodiment, the well contact 46 is denoted as the first contact 46, and a point of contact between the first contact 46 and the pixel ground wiring 51 is referred to as the point A. The first contact 46 may be a plurality of first contacts 46. In this case, any one of the plurality of first contacts 46 is representatively referred to as the point A.

Figure 11:
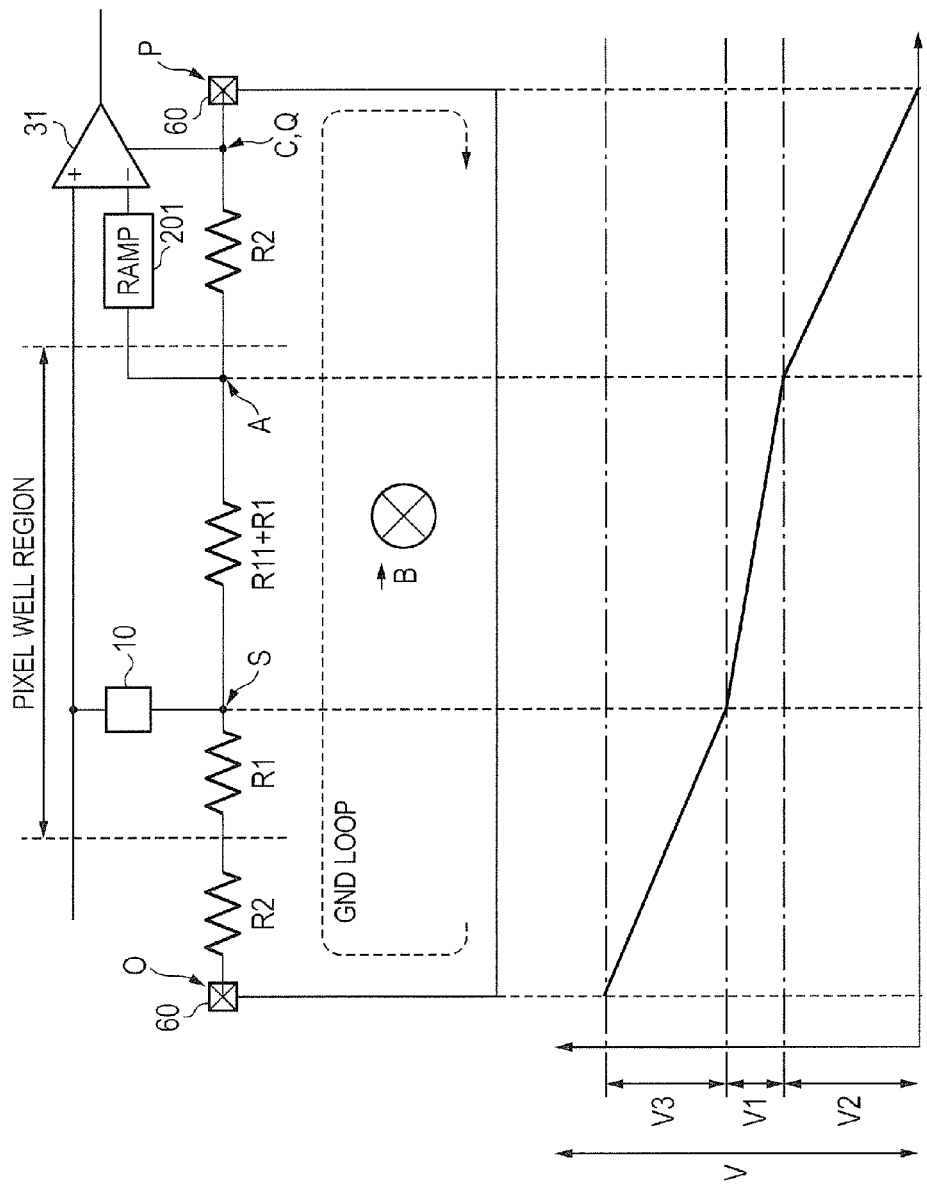
FIG. 11 is a schematic illustration of an equivalent circuit of a ground loop and a ground voltage distribution in the solid-state image pickup element according to the fifth embodiment of the present invention.

FIG. 11 is a schematic illustration of an equivalent circuit of the ground loop and a ground voltage distribution in the solid-state image pickup element 1b according to the fifth embodiment of the present invention. The equivalent circuit of the ground loop according to this embodiment illustrated in FIG. 11 is the same as the equivalent circuit of the ground loop according to the first embodiment illustrated in FIG. 6 except that the differential amplifier circuit 30 is replaced by the AD converter 31 and the hold capacitor 200 is replaced by the ramp signal generating circuit 201. Therefore, the induced voltage differences V1 to V3 between the respective points on the ground loop are expressed by Expressions (1) to (3) above similarly to the case of the first embodiment.

As described above, also in this embodiment, a first feature is that the ground terminal of the ramp signal generating circuit 201 is connected to the pixel ground wiring 51 via the first contact 46. Further, a second feature is that the electrical resistance value R2 of the ground connecting part 52 that connects the pixel ground wiring 51 to the peripheral ground wiring 50 is set to be large so as to satisfy Expression (6) above. This can reduce magnetic noise caused in the ground wiring.

Figure 12A:
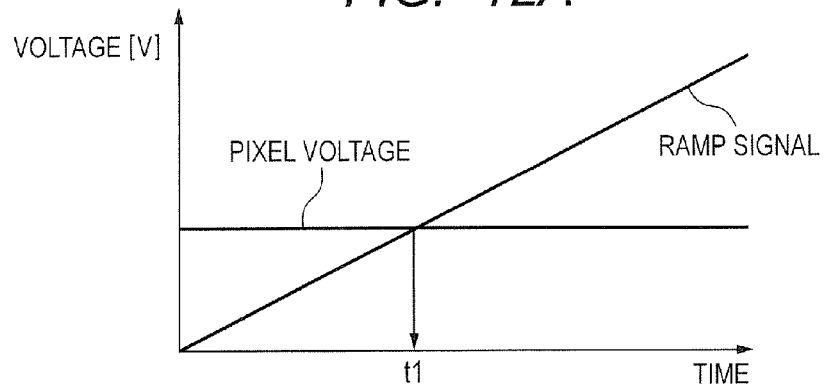
FIG. 12A is a first graph for showing magnetic noise included in input to an AD converter according to the fifth embodiment of the present invention.
Figure 12B:
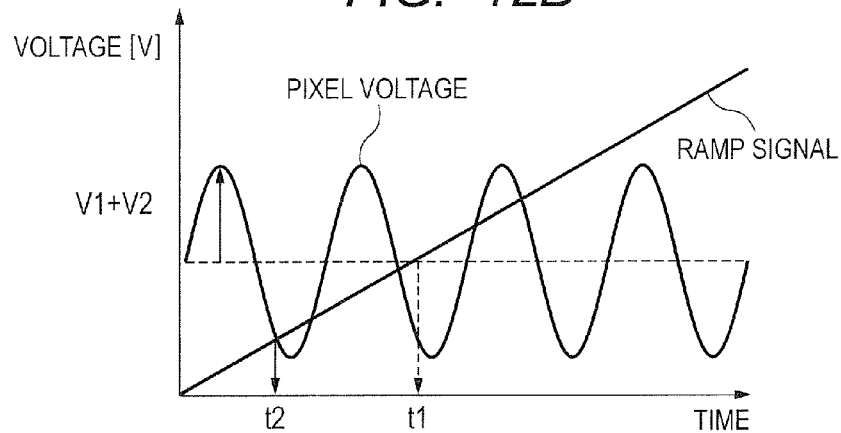
FIG. 12B is a second graph for showing magnetic noise included in input to the AD converter according to the fifth embodiment of the present invention.
Figure 12C:
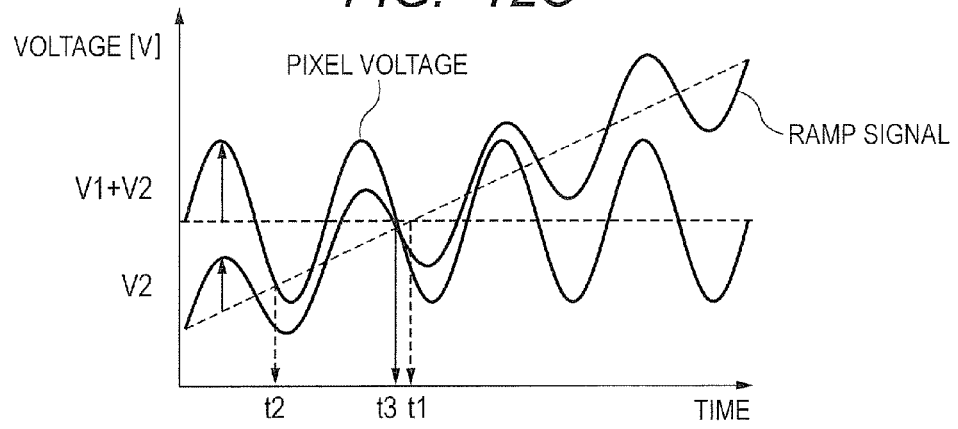
FIG. 12C is a third graph for showing magnetic noise included in input to the AD converter according to the fifth embodiment of the present invention.

FIG. 12A to FIG. 12C are graphs for showing magnetic noise included in input to the AD converter 31 according to the fifth embodiment of the present invention. The AD converter 31 according to this embodiment compares the signal from the pixel 10 with the reference signal and performs A/D conversion. In this case, the signal from the pixel 10 includes, as magnetic noise, the induced voltage difference V1+V2 at the point S connected to the ground terminal of the pixel 10. On the other hand, the reference signal includes, as magnetic noise, the induced voltage difference V2 at the point A connected to the ground terminal of the ramp signal generating circuit 201. Therefore, output of the AD converter 31 includes, as the magnetic noise output Vout, the induced voltage difference V1 between the points A and S expressed by Expression (4) above as the difference of the induced voltage differences. In the description below, it is assumed that the magnetic flux B sinusoidally changes over time.

FIG. 12A is a graph for showing waveforms that change over time of an ideal signal from the pixel 10 and an ideal RAMP signal when magnetic noise is not included in both of the signal from the pixel 10 and the reference signal. The AD converter 31 performs digital conversion of the signal from the pixel 10 at a time t1 at which the signal from the pixel 10 and the RAMP signal are the same, and outputs the converted signal as a pixel signal.

FIG. 12B is a graph for showing waveforms that change over time of a signal from the pixel 10 and a RAMP signal when magnetic noise is included only in the signal from the pixel 10. This corresponds to the case in which the first feature of the present invention described above is not satisfied. Specifically, this is a case in which the ground terminal of the ramp signal generating circuit 201 illustrated in FIG. 11 is connected not to the pixel ground wiring 51 (point A) but to the peripheral ground wiring 50 (point Q). In this case, the induced voltage difference V1+V2 is caused at the point S connected to the ground terminal of the pixel 10. On the other hand, almost no induced voltage is caused at the point Q connected to the ground terminal of the ramp signal generating circuit 201. The AD converter 31 converts, into a digital signal, the signal from the pixel 10 at a time t2 at which the signal from the pixel 10 and the RAMP signal are the same, and outputs the converted signal as a pixel signal. As a result, the signal has an error corresponding to a time t1-t2 from the proper output signal.

FIG. 12C is a graph for showing waveforms that change over time of a signal from the pixel 10 and a RAMP signal when magnetic noise is included in both of the signal from the pixel 10 and the reference signal. This corresponds to the case in which the first feature of the present invention described above is not satisfied. Specifically, this is a case in which the ground terminal of the ramp signal generating circuit 201 illustrated in FIG. 11 is connected to the pixel ground wiring 51 (point A). In FIG. 12C, the induced voltage difference V1+V2 is caused at the point S connected to the ground terminal of the pixel 10. On the other hand, the induced voltage difference V2 is caused at the point A connected to the ground terminal of the ramp signal generating circuit 201. The AD converter 31 converts, into a digital signal, the signal from the pixel 10 at a time t3 at which the signal from the pixel 10 and the RAMP signal are the same, and outputs the converted signal as a pixel signal. As a result, the signal has an error corresponding to a time t1-t3 from the proper output signal, but t1-t3<t1-t2, and thus, magnetic noise caused in the ground wiring can be reduced.

The induced voltage difference V1 caused at the electrical resistance value R11+R1 is a factor of causing such an error of t1-t3. When the induced voltage difference V1 is small enough to ignore, in other words, when the second feature of the present invention described above is further satisfied, the signal from the pixel 10 and the RAMP signal contain substantially the same sinusoidal waves. Under this condition, the errors corresponding to the time t1-t3 of the signal from the pixel 10 and the RAMP signal respectively oscillate substantially in the same way with respect to the ideal signals shown in FIG. 12A, and thus, the output signal of the AD converter 31 is a signal substantially corresponding to the time t1.

As described above, according to this embodiment, the readout circuit (AD converter) is included that is arranged in the peripheral well region in which the peripheral ground wiring is arranged and that is configured to read a signal from pixels in the same column with reference to the reference signal. Further, the reference signal circuit (ramp signal generating circuit) is included that has the ground terminal electrically connected to the pixel ground wiring via the first contact and that is configured to output the reference signal to the readout circuit. Further, the minimum value R2 of the electrical resistance values from the pixel ground wiring to the peripheral ground wiring is set to be large so as to satisfy Expression (6) above. Consequently, it is possible to obtain a solid-state image pickup element, a method of manufacturing a solid-state image pickup element, and an image pickup system that can reduce magnetic noise caused in the ground wiring without additionally providing a circuit for reducing the noise. It is also possible to combine this embodiment with the second to fourth embodiments described above.

The ramp signal generating circuit 201 according to this embodiment is formed in the third well region 103. The third well region 103 may be formed in the pixel well region 101 or the peripheral well region 100. However, in this case, it is necessary that the third well region 103 in which the ramp signal generating circuit 201 is formed and the peripheral well region 100 be not connected to each other via a common well, that is, the two regions are required to be formed as well regions independent of each other. In this case, the third well region 103 serving as an external ground of the ramp signal generating circuit 201 is connected via low resistance wiring extended from the pixel ground wiring 51.

Sixth Embodiment

Figure 13:
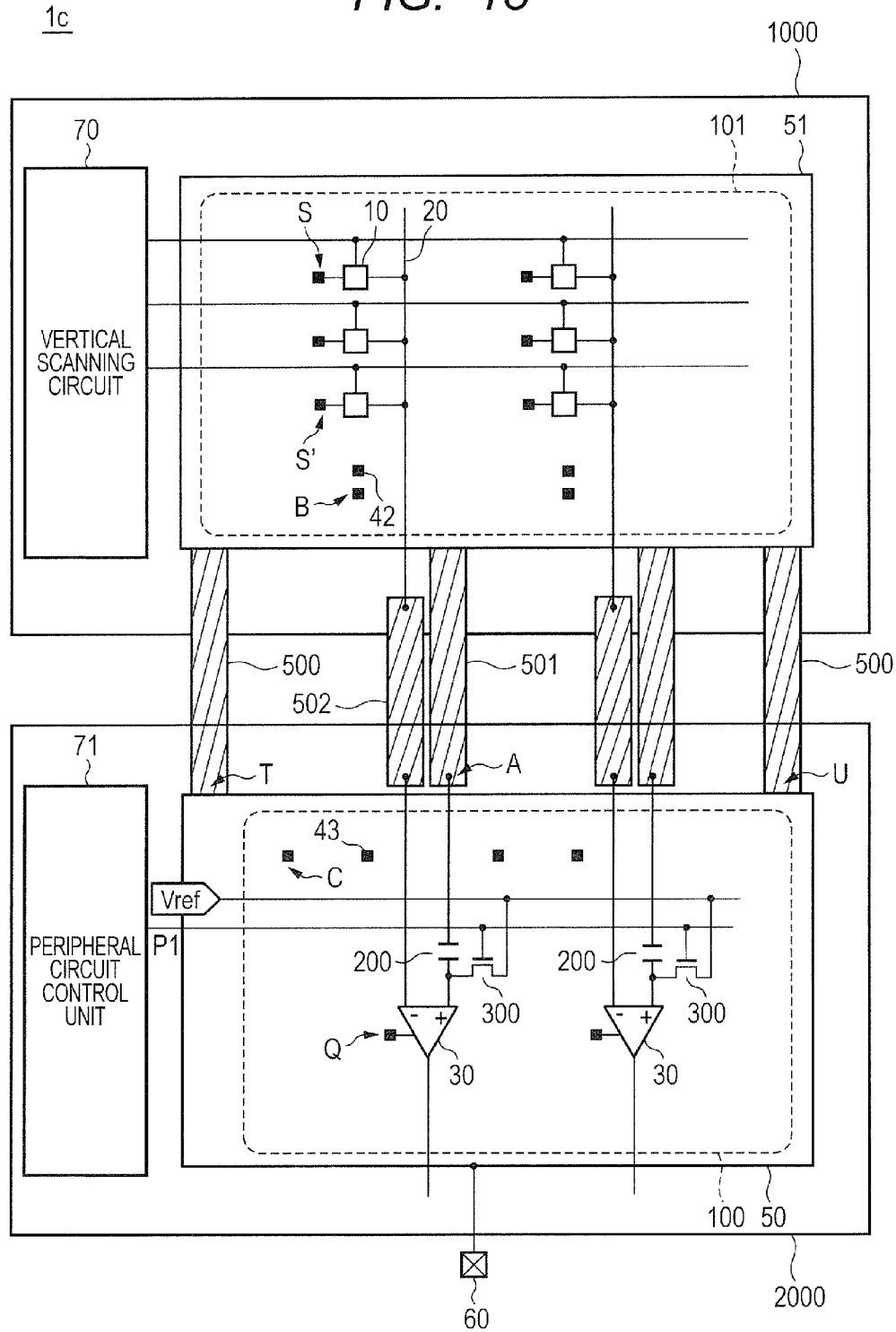
FIG. 13 is a schematic illustration of a configuration of a solid-state image pickup element according to a sixth embodiment of the present invention.

A solid-state image pickup device according to a sixth embodiment of the present invention is described with reference to FIG. 13 to FIG. 15. FIG. 13 is a schematic illustration of a configuration of a solid-state image pickup element 1c according to the sixth embodiment of the present invention. In this embodiment, a case is described in which the pixel well region 101 and the peripheral well region 100 are arranged on different semiconductor substrates.

The solid-state image pickup element 1c according to this embodiment illustrated in FIG. 13 is an example of a stacked type solid-state image pickup element including a semiconductor substrate 1000 and a semiconductor substrate 2000. The semiconductor substrate 1000 and the semiconductor substrate 2000 are connected to each other via at least a connecting electrode 501. In this embodiment, connecting electrode 500 and 502 are also used for connecting the semiconductor substrate 1000 and the semiconductor substrate 2000 to each other. Components relating to the pixels 10, such as the pixel well region 101, the vertical scanning circuit 70, and the pixel ground wiring 51, are included in the semiconductor substrate 1000. On the other hand, components relating to the peripheral circuit, such as the peripheral well region 100, the peripheral circuit control unit 71, the differential amplifier circuit 30, the peripheral ground wiring 50, and the hold capacitor 200, are included in the semiconductor substrate 2000.

The connecting electrode 500 connects the pixel ground wiring 51 to the peripheral ground wiring 50. The connecting electrode 501 connects the hold capacitor 200 to the pixel ground wiring 51. The connecting electrode 502 connects the vertical signal line 20 to the inverting input terminal (−) of the differential amplifier circuit 30. The connecting electrode 500 corresponds to the ground connecting part 52 in the first embodiment in terms of an equivalent circuit, and the connecting electrode 501 corresponds to the first contact 48 in the first embodiment in terms of an equivalent circuit. The pixel ground wiring 51 and the peripheral ground wiring 50 are connected to each other via a plurality of connecting electrodes 500 in order to reduce the wiring impedance of the power supply. In this embodiment, the wirings are connected to each other at two places. The peripheral ground wiring 50 is electrically connected to an external ground voltage outside the solid-state image pickup element 1c via the external ground terminal 60. Other points are the same as those of the first embodiment, and thus, description thereof is omitted.

Figure 14:
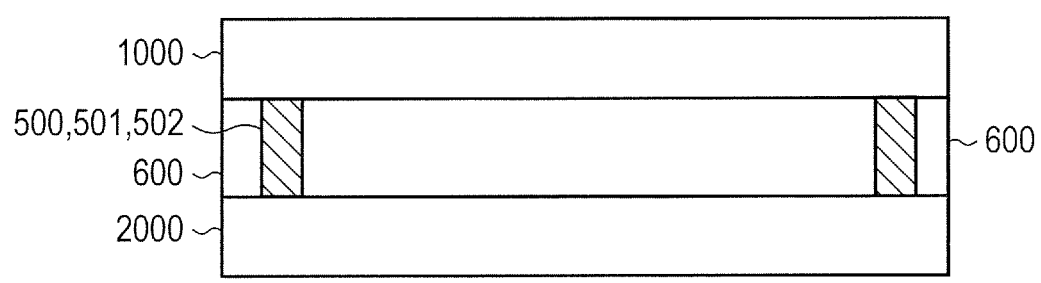
FIG. 14 is a schematic sectional view for illustrating a configuration of a solid-state image pickup element according to the sixth embodiment of the present invention.

FIG. 14 is a schematic sectional view for illustrating a configuration of the solid-state image pickup element 1c according to the sixth embodiment of the present invention. The semiconductor substrate 1000 and the semiconductor substrate 2000 are connected to each other via the connecting electrodes 500, 501, and 502 with an insulator 600 sandwiched between the substrates. In FIG. 14, the connecting electrodes 500, 501, and 502 are collectively illustrated, but actually, the connecting electrodes 500 are arranged at two places, and the connecting electrodes 501 and 502 are arranged so as to correspond to the arranged pixels. The insulator 600 may be formed of an anti-magnetic material (material having a high permeability) except for portions thereof near the connecting electrodes 500, 501, and 502.

Figure 15:
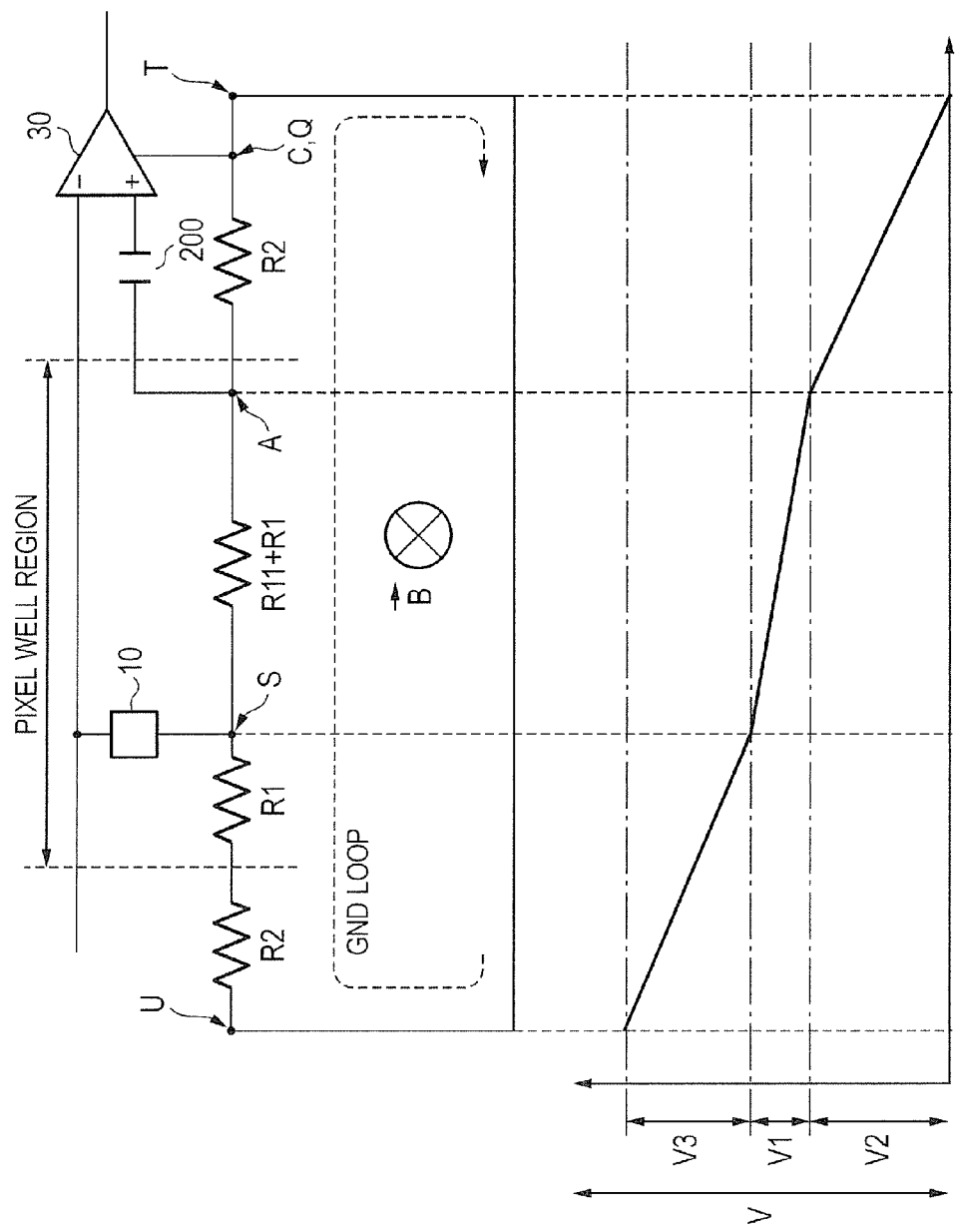
FIG. 15 is a schematic illustration of an equivalent circuit of a ground loop and a ground voltage distribution in the solid-state image pickup element according to the sixth embodiment of the present invention.

FIG. 15 is a schematic illustration of an equivalent circuit of the ground loop and a ground voltage distribution in the solid-state image pickup element 1c according to the sixth embodiment of the present invention. This is a case in which, different from the case illustrated in FIG. 6, a ground loop is formed by the semiconductor substrate 1000 and the semiconductor substrate 2000 via points U and T. Similarly to the case of the first embodiment, the induced voltage differences V1 to V3 are expressed by Expressions (8) to (10) below.

$$V1=V \times (R11+R1)/(R11+2 \times R1+2 \times R2) \qquad (8)$$

$$V2=V \times R2/(R11+2 \times R1+2 \times R2) \qquad (9)$$

$$V3=V \times (R2+R1)/(R11+2 \times R1+2 \times R2) \qquad (10)$$

Also in this embodiment, the electrical resistance values R1, R11, and R2 are set so as to satisfy Expression (5) and Expression (6) above. The resistance value R1 of an electrical path from one of the plurality of pixel well contacts 42 to the ground electrode 53 and the resistance value R2 of an electrical path from the peripheral well contact 43 closest to the ground electrode 53 (point C) to the ground electrode 53 satisfy the relationship of R1<R2. Such a configuration can obtain an effect similar to that of the first embodiment. In other words, the ground electrode 53 of the hold capacitor 200 is connected to the pixel ground wiring 51, and thus, magnetic noise caused in the ground wiring can be reduced.

As described above, in this embodiment, through forming the stacked type solid-state image pickup device using the connecting electrodes, the area relating to the peripheral circuit can be reduced, and thus, the chip size of the solid-state image pickup device can be reduced compared with that of the first embodiment.

Further, the electrical resistance values can be adjusted through adjusting the arrangement positions of the connecting electrodes 500 to 502 of the semiconductor substrates 1000 and 2000, and the electrical resistance values R1 and R2 can be adjusted through appropriately selecting the materials of the connecting electrodes, and thus, the electrical resistance values can be designed with ease. Therefore, the design flexibility in reducing the proportionality constant k in Expression (1′) above is improved, and thus, an effect similar to that of the first embodiment can be obtained more effectively. The configuration of this embodiment can also be applied to the fifth embodiment.

Seventh Embodiment

Figure 16:
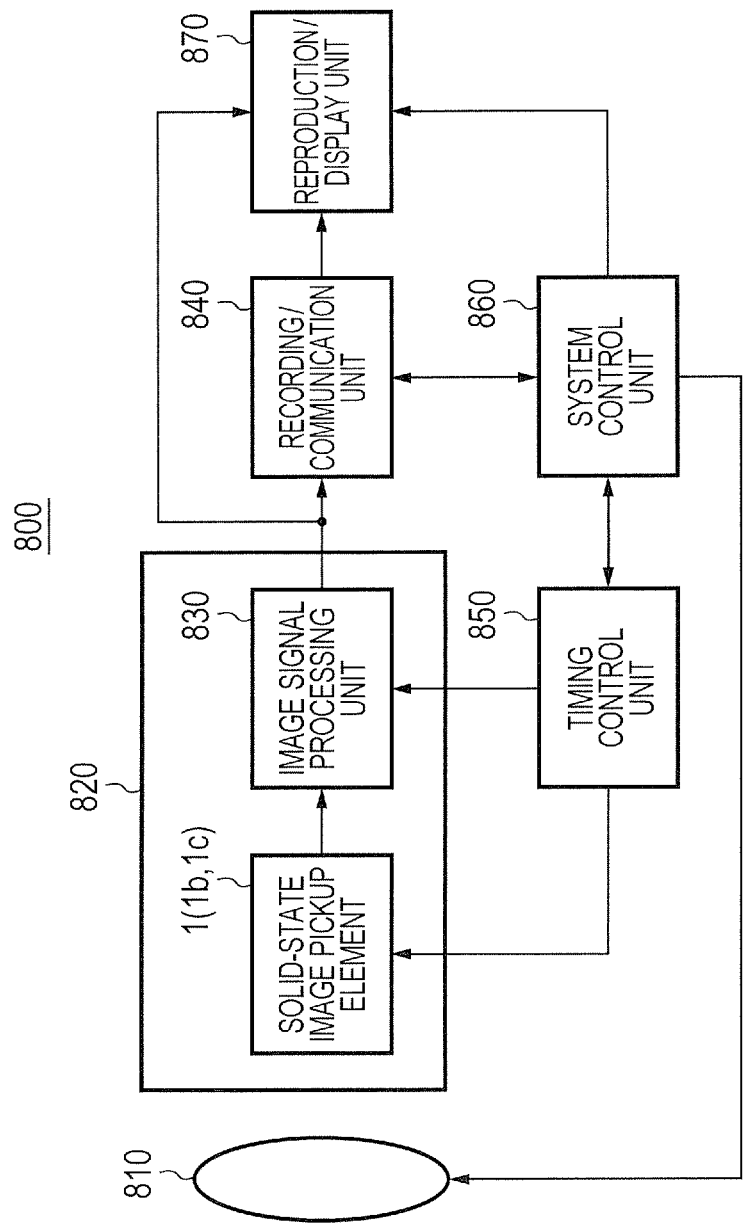
FIG. 16 is an illustration of a configuration of an image pickup system according to a seventh embodiment of the present invention.

In the following, an image pickup system according to a seventh embodiment of the present invention is described with reference to FIG. 16. FIG. 16 is an illustration of a configuration of the image pickup system according to the seventh embodiment of the present invention. In this embodiment, a case of an image pickup system to which the configuration according to the first to sixth embodiments is applied is described.

An image pickup system 800 illustrated in FIG. 16 includes, for example, an optical unit 810, an image pickup apparatus 820, a recording/communication unit 840, a timing control unit 850, a system control unit 860, and a reproduction/display unit 870. The image pickup apparatus 820 includes the solid-state image pickup element 1 (or 1b or 1c, the same applies below) and an image signal processing unit 830. The photoelectric conversion device described in the first to sixth embodiments is used as the solid-state image pickup element 1.

The optical unit 810 serving as an optical system such as a lens collects light from an object onto a pixel array in which a plurality of pixels of the solid-state image pickup element 1 are two-dimensionally arranged, to thereby form an image of the object. The solid-state image pickup element 1 outputs a signal depending on the light collected onto the pixel array at a timing based on a signal from the timing control unit 850. The signal that is output from the solid-state image pickup element 1 is input to the image signal processing unit 830, and the image signal processing unit 830 performs signal processing in accordance with a method defined by a program or the like. A signal obtained through the processing by the image signal processing unit 830 is sent to the recording/communication unit 840 as image data. The recording/communication unit 840 sends a signal for forming an image to the reproduction/display unit 870 to cause the reproduction/display unit 870 to reproduce/display moving images or a still image. The recording/communication unit 840 also communicates, after receiving a signal from the image signal processing unit 830, to/from the system control unit 860, and records a signal for forming an image on a recording medium (not shown).

The system control unit 860 has centralized control over operation of the image pickup system 800, and controls drive of the optical unit 810, the timing control unit 850, the recording/communication unit 840, and the reproduction/display unit 870. The optical unit 810 is driven by a motor (not shown), for example, and performs image stabilization and adjusts a focal position. In the first to sixth embodiments, a magnetic noise source that influences the ground wiring is, for example, a magnetic field generated by the motor.

Further, the system control unit 860 includes a storage device (not shown) that is, for example, a recording medium, and a program necessary for controlling operation of the image pickup system 800 and the like are stored in the storage device. Further, the system control unit 860 supplies, into the image pickup system 800, for example, a signal for switching drive modes in response to operation by a user. Specific examples include change of a row to be read or a row to be reset, change in angle of view accompanying electronic zoom, and shift of the angle of view accompanying electronic vibration isolation. The timing control unit 850 controls drive timing of the solid-state image pickup element 1 and the image signal processing unit 830 based on control by the system control unit 860.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-178247, filed Sep. 10, 2015, and Japanese Patent Application No. 2016-053833, filed Mar. 17, 2016, which are hereby incorporated by reference herein in their entirety.

What is claimed is:

1. A solid-state image pickup element, comprising:
    a semiconductor substrate including a pixel well region and a peripheral well region;
    a pixel ground wiring arranged on the pixel well region;
    a peripheral ground wiring arranged on the peripheral well region;
    a plurality of pixel well contacts connecting the pixel ground wiring and the pixel well region;
    a plurality of peripheral well contacts connecting the peripheral ground wiring and the peripheral well region;
    a plurality of pixels arranged in the pixel well region in a plurality of columns, each of the plurality of pixels being configured to output a pixel signal;
    a readout circuit arranged in the peripheral well region, the readout circuit including a first input terminal configured to receive the pixel signal from each of the plurality of pixels and a second input terminal configured to receive a reference signal;
    a reference signal circuit arranged in the peripheral well region, the reference signal circuit including a first electrode to which a ground voltage is supplied, and being configured to output the reference signal to the second input terminal of the readout circuit; and
    a wiring connecting the first electrode of the reference signal circuit and the pixel ground wiring,
    wherein a resistance value R1 of an electrical path from one of the plurality of pixel well contacts to the first electrode and a resistance value R2 of an electrical path from one of the plurality of peripheral well contacts closest to the first electrode to the first electrode satisfy a relationship of R1<R2.

2. A solid-state image pickup element according to claim 1, wherein the relationship of R1<R2 is satisfied with regard to each of the plurality of pixel well contacts.

3. A solid-state image pickup element according to claim 1,
    wherein the readout circuit comprises a differential amplifier circuit configured to amplify the signal from each of the plurality of pixels with reference to the reference signal, and
    wherein the reference signal circuit comprises a capacitor, the capacitor including the first electrode and a second electrode arranged so as to oppose the first electrode and connected to the second input terminal of the readout circuit.

4. A solid-state image pickup element according to claim 3,
    wherein the reference signal circuit comprises a switch transistor connected to the second electrode of the capacitor, and
    wherein the reference signal is held in the capacitor through controlling the switch transistor.

5. A solid-state image pickup element according to claim 1,
    wherein the readout circuit comprises an analog-to-digital converter configured to perform analog-to-digital conversion of the signal from each of the plurality of pixels with reference to the reference signal, and wherein the reference signal circuit comprises a ramp signal generating circuit configured to generate, as the reference signal, a ramp signal that changes over time.

6. A solid-state image pickup element according to claim 1, wherein the pixel ground wiring and the peripheral ground wiring are electrically connected to each other via a ground connecting part.

7. A solid-state image pickup element according to claim 6, wherein the ground connecting part serpentines in a direction along the plurality of columns and in a direction intersecting the plurality of columns.

8. A solid-state image pickup element according to claim 6, wherein the ground connecting part is electrically connected to an external ground voltage via an external ground terminal.

9. A solid-state image pickup element according to claim 6, wherein the ground connecting part is configured to connect different wiring layers to each other via a well contact.

10. A solid-state image pickup element according to claim 6, wherein the ground connecting part comprises a semiconductor region arranged on the semiconductor substrate.

11. A solid-state image pickup element according to claim 1, wherein the peripheral ground wiring and the pixel ground wiring forms a loop.

12. A solid-state image pickup element according to claim 1,
wherein the peripheral well region comprises a first peripheral well region and a second peripheral well region,
wherein the pixel well region is arranged between the first peripheral well region and the second peripheral well region, and
wherein the peripheral ground wiring comprises a first peripheral ground wiring arranged on the first peripheral well region and a second peripheral ground wiring arranged on the second peripheral well region.

13. A solid-state image pickup element according to claim 1, wherein the readout circuit is connected to the peripheral ground wiring.

14. A solid-state image pickup element according to claim 1,
wherein the semiconductor substrate comprises a first semiconductor substrate and a second semiconductor substrate,
wherein the pixel well region is arranged on the first semiconductor substrate, and
wherein the peripheral well region is arranged on the second semiconductor substrate.

15. A solid-state image pickup element, comprising:
a semiconductor substrate including a pixel well region and a peripheral well region;
a pixel ground wiring arranged on the pixel well region;
a peripheral ground wiring arranged on the peripheral well region;
a plurality of pixel well contacts connecting the pixel ground wiring and the pixel well region;
a plurality of pixels arranged in the pixel well region in a plurality of columns, each of the plurality of pixels being configured to output a pixel signal;
a readout circuit arranged in the peripheral well region, the readout circuit including a first input terminal configured to receive the pixel signal from each of the plurality of pixels and a second input terminal configured to receive a reference signal;
a reference signal circuit arranged in the peripheral well region, the reference signal circuit including a first electrode to which a ground voltage is supplied, and being configured to output the reference signal to the second input terminal of the readout circuit; and
a wiring connecting the first electrode of the reference signal circuit and the pixel ground wiring,
wherein a resistance value R1 of an electrical path from one of the plurality of pixel well contacts to the first electrode and a resistance value R2 of an electrical path from the peripheral ground wiring to the first electrode satisfy a relationship of R1<R2.

16. An image pickup system, comprising:
the solid-state image pickup element according to claim 1; and
an image signal processing unit configured to process an output signal from the readout circuit of the solid-state image pickup element.

17. An image pickup system according to claim 16, further comprising:
an optical unit configured to collect light from an object onto the solid-state image pickup element; and
a motor configured to drive the optical unit.

* * * * *